(12) United States Patent
Pellizzer et al.

(10) Patent No.: US 9,269,747 B2
(45) Date of Patent: Feb. 23, 2016

(54) SELF-ALIGNED INTERCONNECTION FOR INTEGRATED CIRCUITS

(75) Inventors: Fabio Pellizzer, Cornate d'Adda (IT);
Antonino Rigano, Pioltello (IT);
Roberto Somaschini, Vimercate (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 507 days.

(21) Appl. No.: 13/593,065

(22) Filed: Aug. 23, 2012

(65) Prior Publication Data

US 2014/0054534 A1    Feb. 27, 2014

(51) Int. Cl.
| | |
|---|---|
| H01L 27/24 | (2006.01) |
| H01L 45/00 | (2006.01) |
| H01L 21/768 | (2006.01) |
| H01L 21/033 | (2006.01) |
| H01L 21/311 | (2006.01) |

(52) U.S. Cl.
CPC ...... H01L 27/2445 (2013.01); H01L 21/76816 (2013.01); H01L 45/06 (2013.01); H01L 45/1233 (2013.01); H01L 45/16 (2013.01); H01L 45/1675 (2013.01); H01L 21/0337 (2013.01); H01L 21/31144 (2013.01)

(58) Field of Classification Search
CPC ...... H01L 21/768; H01L 27/2454; G03F 7/70
USPC .......... 257/4, E21, 773, E23.577, 3, 328; 438/618, 703; 365/230.03, 230.04, 365/63–72; 430/322
See application file for complete search history.

(56) References Cited

U.S. PATENT DOCUMENTS

| | | | |
|---|---|---|---|
| 6,136,643 A * | 10/2000 | Jeng et al. ..................... 438/253 |
| 7,737,039 B2 | 6/2010 | Sandhu et al. | |
| 7,754,522 B2 * | 7/2010 | Liu ..................... G11C 13/0004 257/3 |
| 7,829,262 B2 | 11/2010 | Tran | |
| 7,863,173 B2 | 1/2011 | Kang et al. | |
| 7,873,935 B2 | 1/2011 | Jung et al. | |
| 7,972,959 B2 | 7/2011 | Mebarki et al. | |
| 2003/0199169 A1 | 10/2003 | Jun et al. | |
| 2006/0278921 A1 * | 12/2006 | Pellizzer ............. H01L 27/2454 257/328 |
| 2009/0179187 A1 | 7/2009 | Liu et al. | |
| 2010/0054030 A1 | 3/2010 | Lowrey | |
| 2010/0232200 A1 | 9/2010 | Shepard | |
| 2011/0014574 A1 | 1/2011 | Tran | |
| 2011/0059403 A1 | 3/2011 | Sukekawa | |
| 2013/0236836 A1 * | 9/2013 | Sun ........................... G03F 7/70 430/322 |

* cited by examiner

*Primary Examiner* — Kenneth Parker
*Assistant Examiner* — Young W Kim
(74) *Attorney, Agent, or Firm* — Knobbe, Martens, Olson & Bear LLP

(57) ABSTRACT

Methods and structures provide horizontal conductive lines of fine pitch and self-aligned contacts extending from them, where the contacts have at least one dimension with a more relaxed pitch. Buried hard mask materials permit self-alignment of the lines and contacts without a critical mask, such as for word-line electrode lines and word-line contacts in a memory device.

7 Claims, 19 Drawing Sheets

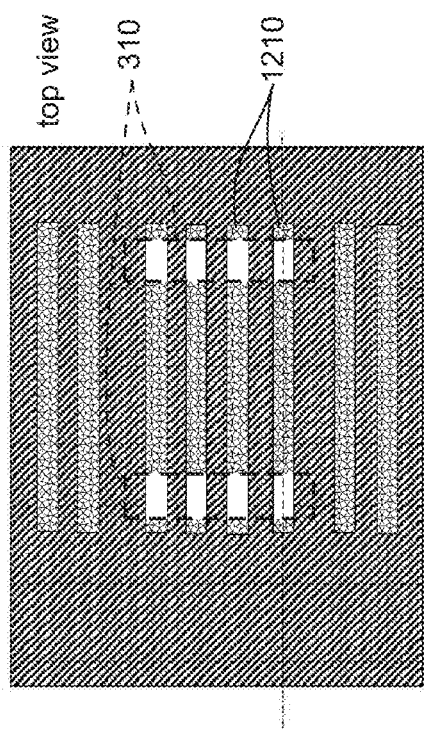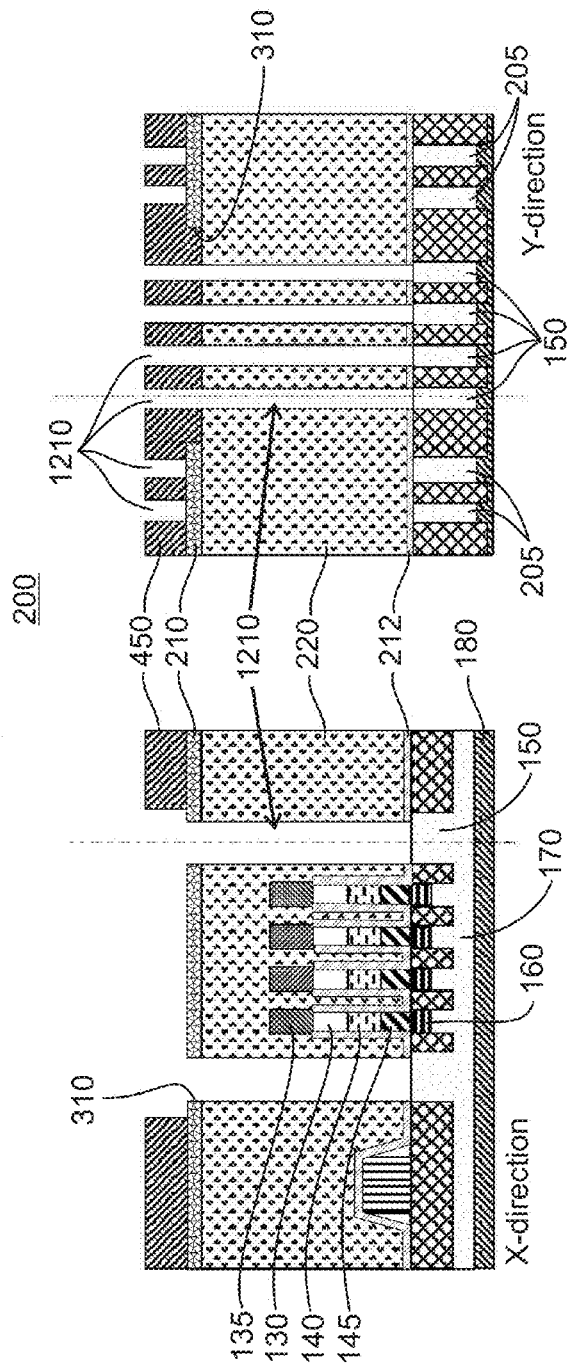
FIG. 12

US 9,269,747 B2

SELF-ALIGNED INTERCONNECTION FOR INTEGRATED CIRCUITS

FIELD

Subject matter disclosed herein may relate to integrated circuit devices, and may relate, more particularly, to memory-related circuitry.

BACKGROUND

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for any particular application may include, physical size, storage density, operating voltages, granularity of read/write operations, throughput, transmission rate, and/or power consumption, for example. Other example factors that may be of interest to system designers may include cost of manufacture and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 2-13 are illustrations depicting plan and cross-sectional views of processing stages associated with forming an example memory device, such as a PCM device, according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Similarly, references to vertical and horizontal are to be understood relative to one another and/or to a substrate orientation, and do not limit the overall orientation of the entire device. Therefore, the following detailed description is not to be taken to limit the scope of claimed subject matter and/or equivalents.

DETAILED DESCRIPTION

While embodiments are disclosed herein for a particular application, namely forming word-lines and word-line contacts for a phase change memory (PCM) device, the claimed subject matter is not limited in this respect. The skilled artisan will find application for the methods and structures disclosed herein for other memory and non-memory integrated circuit applications.

Figure 1:
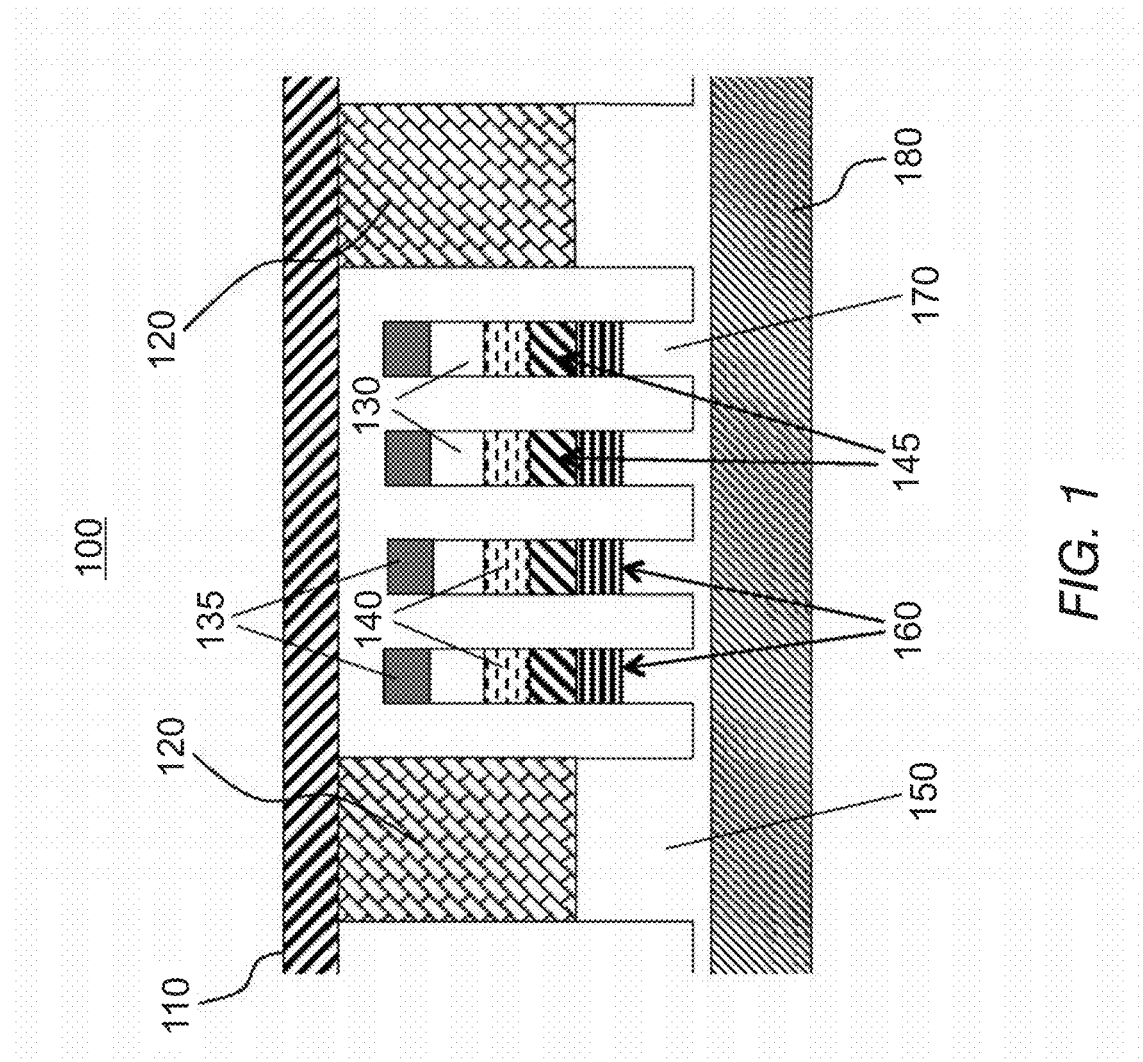
FIG. 1 is an illustration depicting a cross-sectional view of a memory device, such as a PCM device.

FIG. 1 is an illustration depicting a cross-sectional view of an embodiment 100 of a memory device comprising a phase change memory (PCM) with one or more selector devices formed over and/or on a surface of a substrate (not shown). In an embodiment, a memory device, such as device 100, may employ one or more transistors, such as one or more bipolar junction transistors (BJTs), for example, as selectors for individual memory cells. For example, a memory device, such as 100, may comprise one or more transistors including one or more collector components, such as collector 180, one or more base components, such as base 170, and one or more emitter components, such as one or more emitters 160. In an embodiment, an emitter, base, and collector combination may form one or more bipolar junction transistors, for example. In an embodiment, the base 170 and collector 180 may be common across one or more transistors, although claimed subject matter is not limited in scope in these respects. The collector 180, base 170 and emitter 160 may be formed from doped regions of a bulk semiconductor substrate, or from epitaxial layers.

Also depicted in FIG. 1 are heater components 145 and phase change memory (PCM) material 140. In other implementations, a self-heater PCM storage element can be employed and separate heater components can be omitted. In an embodiment, a memory storage element, such as PCM material 140, may be selected, such as by use of sufficient and/or appropriate signals, such as voltage signals, with a first electrode, such as word-line electrode 110, and/or with a second electrode, such as bit-line electrode 135. An electrically conductive component, such as an "electrode," refers to a component that may be utilized to route signals and/or to supply power within an integrated circuit, such as within a memory array. An electrically conductive component, such as an electrode, may comprise a sufficiently electrically conductive material, such as polysilicon, carbon, and/or metallic material, such as tungsten, titanium nitride, and/or titanium aluminum nitride, for example, for use in a memory device. Example electrically conductive components may include, for example, word-line interconnects 120, word-line contacts 150, word-line electrode 110, bit-line contacts 130, and/or bit-line electrodes 135. Of course, claimed subject matter is not limited in scope in these respects. Other materials may, of course, also be used in one or more embodiments.

In an embodiment, a voltage signal may be used in conjunction with an electrode, such as word-line electrode 110, and may be used in conjunction with a base component, such as base 170, via one or more electrically conductive components, such as an interconnect and/or a contact, for example, word-line interconnect 120 and/or word-line contact 150. Also, in an embodiment, a voltage signal for a base component, such as base 170, may be employed with one or more emitters, such as one or more emitters 160, and a collector component, such as collector 180. In an embodiment, a particular storage component, such as a particular PCM material 140, may be accessed at least in part by use of appropriate voltage signal levels for a first electrode, such as word-line electrode 110, and/or for a second electrode, such as a particular bit-line electrode 135, for example. A voltage signal may be employed to energize one or more bipolar transistors, for example. In an embodiment, an electrically conductive component, such as a word-line interconnect 120, may comprise tungsten, although claimed subject matter is not limited in this respect.

For a memory device, such as PCM device 100, a memory storage element, such as PCM material 140, may comprise a chalcogenide material, in an embodiment. A PCM storage element, for example, may have a configuration to retain or store a memory state comprising one of at least two different selectable states. In a binary system, states may comprise a binary "0" value or a binary "1" value, where a "set" state, representing a binary value of '1', for example, may correspond to a more crystalline, more conductive state for a PCM material and a "reset" state, representing a binary value of '0', for example, may correspond to a more amorphous, more resistive state. In other systems, at least some individual storage elements of memory cells may have a configuration to store more than two levels or states. In a PCM array, heat sufficient to change a phase of a memory storage element, and thus to change the logic state of the memory cell, may be achieved by use of a current and/or voltage pulse, in an embodiment. Further, in one or more example embodiments, memory devices may comprise one or more technologies other than PCM, such as resistive memory technologies and/or other types of memory, and claimed subject matter is not limited in scope in this respect.

For example, for embodiment 100 depicted in FIG. 1, a base component, such as base 170, may be patterned, at least in part, by forming one or more trenches positioned in a semiconductor material in a direction that crosses with (e.g., is approximately orthogonal to) the orientation of word-line electrode 110. In an embodiment, a shallow-trench isolation (STI) structure may be implemented to separate lines extending in the bit-line direction that include upper portions of the base 170 as well as emitter 160, heater components 145 (if present), PCM material 140, bit-line contacts 130 and bit-line electrode 135, although claimed subject matter is not limited in scope in this respect. A deeper trench isolation compared to the STI, which can be referred to as deep trench isolation (DTI), may also be employed to separate word-lines from one another, such as words-lines formed by the lower portions of the layer forming the bases 170 and the base line contacts 150 in the word-line direction, as will be better understood from the description of FIG. 2 below. In an embodiment, one or more trenches in accordance with an STI implementation may be formed at least in part by a plasma etch process, although again, claimed subject matter is not limited in scope in this respect. Also, in an embodiment, a base component, such as base component 170, may be formed at least in part by epitaxy, although claimed subject matter is not limited in scope in this respect. For example, a solid epitaxial material of n-doped silicon may be formed, such as by vapor phase deposition, over collector material 180, in an embodiment. In an embodiment, a base component, such as base component 170, of a selector transistor may be heavily doped, such as with an n-buried implant for a pnp BJT selector, for example, to reduce resistance of a base component, such as base component 170.

Multiple mask operations may be utilized to form one or more electrically conductive vertical contacts, also referred to as interconnects, such as one or more word-line interconnects, that may electrically couple an electrode, such as word-line electrode 110, to a buried silicon word-line, such as n+ base component 170, for example. For example, a mask may be utilized to define and/or align contact regions having relatively tight tolerances, and an additional mask may be utilized for word-line electrode double-patterning. Also, one or more masks may be aligned with one or more previous masks.

In an embodiment, self-aligned electrically conductive interconnects, which can also be considered self-aligned contacts, such as word-line interconnects 120, may be formed without an additional mask operation utilizing a pitch multiplication process, such as a self-aligned double patterning (SADP) technique. Techniques taught herein can simultaneously form electrically conductive interconnects, such as word-line interconnects 120, simplifying mask operations as compared with conventional techniques, for example. Whereas conventional pitch multiplication to produce lines and contacts may employ two critical masks for orthogonal patterns and a non-critical mask, the fabrication process may be simplified, for example, by a reduction in an amount of lithographic masks and/or utilization of self-aligned techniques whereby existing structures may be utilized as masks during integrated circuit fabrication. Simplified fabrication techniques may improve manufacturing yield and/or device reliability, for example, and/or may reduce manufacturing time and/or costs. Additionally, by allowing formation of features having dimensions smaller than would otherwise be possible utilizing lithographic techniques, greater memory density may be achieved, among other potential benefits including improved power consumption and device performance, for example.

To create more dense memory arrays, tolerances among electrode dimensions and/or bipolar junction transistor interconnections may become more stringent. For example, an interconnect and/or a contact may connect to an electrode with a tolerance that may approximately comprise a width of word-line electrode 110, as an example. Also, a width of word-line electrode 110 may represent a reduced-size dimension approaching limits of state-of-the-art photolithographic manufacturing techniques. As feature dimensions of components are reduced in an effort to increase memory array densities, it may be more difficult to reliably accomplish a connection between a memory cell component (e.g., base of a BJT selector) and an electrode in a device topology, such as in an STI topology, for example. However, by utilizing a self-aligned double patterning (SADP) technique, for example in a manner depicted in FIGS. 2-13, or in a similar manner, connections between one or more electrically conductive electrodes, such as one or more word-line electrodes 110 and one or more base components, such as base component 170, may be made in a more reliable manner, in accordance with one or more embodiments.

In FIGS. 2-13, discussed below, cross-sectional views of an illustration of a portion of an example PCM memory array are depicted showing various stages of an example fabrication process, in accordance with an embodiment. Of course, claimed subject matter is not limited in scope to the particular examples described herein. In FIGS. 2-13, a top view is provided. Additionally, cross-sectional views looking in two directions, an "X" direction (corresponding to an orientation along which word-lines are elongated) and a "Y" direction (corresponding to an orientation along which bit-lies are elongated), are provided. In an embodiment, an "X" direction may be substantially orthogonal to a "Y" direction. In other arrangements, the word-line direction need not be orthogonal to the bit-line direction. Not shown in any detail in FIGS. 2-13, and not discussed herein except for a brief mention, is circuitry that may be formed around a periphery of a storage array, for example. Rather, FIGS. 2-13 are meant to illustrate example aspects related to fabrication of one or more electrically conductive interconnects, also known as vertical contacts, to electrically couple one or more electrodes, such as one or more word-line electrodes 120, to one or more buried silicon word-lines, such as one or more n+ base components 170, in accordance with one or more embodiments.

Additionally, FIGS. 2-13 may depict what may be referred to as an example "negative" or "inverted positive" SADP technique to define and/or form example word-line patterns. However, negative or positive SADP techniques, for example to change spacer layout, are merely example techniques that may be implemented in accordance with claimed subject matter, and claimed subject matter is not limited in scope in these respects. SADP techniques may be utilized in some embodiments to address issues related to PCM scaling. For example, SADP techniques may help overcome lithography issues related to scaling to create more dense memory arrays. However, other embodiments may not utilize SADP techniques, for example for creating wider structures.

Figure 2:
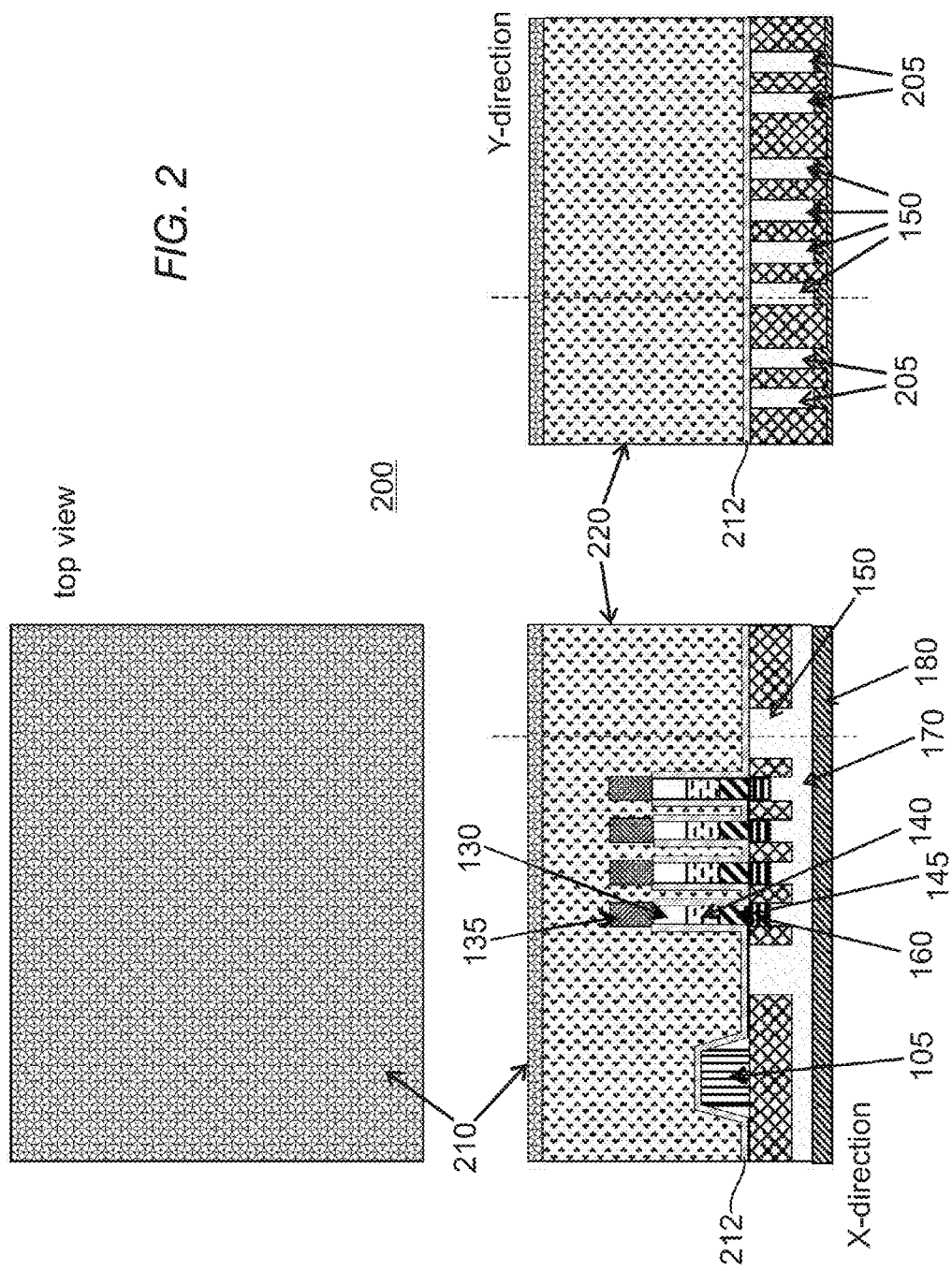

FIG. 2 is an illustration depicting a top view and also depicting cross-sectional views of a portion of an example PCM device 200 showing a stage of an example fabrication process, in accordance with an embodiment. At a stage of an example fabrication process of an example PCM device 200 depicted in FIG. 2, complementary metal oxide semiconductor (CMOS) or other logic circuitry 105 may have been previously formed in and/or on a substrate at and/or near a periphery of an array of PCM storage cells. Additionally, at a stage of an example fabrication process of PCM device 200 depicted in FIG. 2, transistor fabrication may be substantially complete. For example, doping, oxide growth, and/or polysilicon deposition may have formed collector region 180, base region 170, and/or emitters 160. Also depicted in FIG. 2 are heater components 145 and PCM material 140. Although heater components 145 are depicted, other embodiments may not comprise heater components, for example where the PCM material 140 operates as a self-heater. Additionally, electrically conductive bit-line contacts 130 may have been previously formed on PCM material 140, at an example stage of PCM array fabrication process depicted in FIG. 2, in an embodiment. Further, in an embodiment, electrodes, such as bit-line electrodes 135, may have been previously formed at a stage of an example fabrication process of a PCM array depicted in FIG. 2.

As also depicted in FIG. 2, a dielectric region, such as oxide region 220, may also have been previously formed, as well as a dielectric hard mask material 210, such as silicon nitride. Note that while particular materials are mentioned for the illustrated embodiments, the skilled artisan will readily appreciate that other combinations of materials can be employed as long as the materials retain the desired electrical conductivity or insulating characteristics desired (for the non-sacrificial materials in the process flows) and as long as selective etches can be used as described here. For example, generally selective etches are known for distinguishing among silicon nitride, silicon oxide, silicon, carbon and metallic materials, among others. An etch stop layer 212 may be formed over the memory cell stacks prior to forming the interlevel dielectric (oxide region 220), and can also be formed of silicon nitride or other materials on which a selective oxide etch can stop.

Additionally, base contact regions 150 may have been previously formed at a stage of an example fabrication process depicted in FIG. 2. In FIGS. 3-13, discussed below, example techniques may be depicted to electrically couple one or more electrodes, such as one or more word-line electrodes, to one or more base contact regions 150. As used herein, base contact regions 150 can also be referred to as word-line contact regions. As used herein, "word-line contact region" refers to a buried portion of an integrated circuit, such as base component 170, to which a word-line interconnect may eventually be electrically connected.

As can be seen from the Y-direction cross-section on the right-hand side of FIG. 2, the base layer may be separated into multiple word-lines which extend in the X-direction into and out of the paper. The multiple word-lines are shown at the point of the word-line contacts 150. An STI process, for example, may etch fully through the base layer 170 and partially through the collector layer 180 to ensure separation of word-lines. Thus, the collector layer 180 can be shared across an array in both the X- and Y-directions, whereas the base layer 170 can be shared along a word-line in the X-direction. Additionally, "dummy" word-line contact regions 205 are depicted in an example fabrication process depicted in FIG. 2. As used herein, a "dummy word-line contact region" refers to a base contact region to which no active word-line is to be connected.

Figure 3:
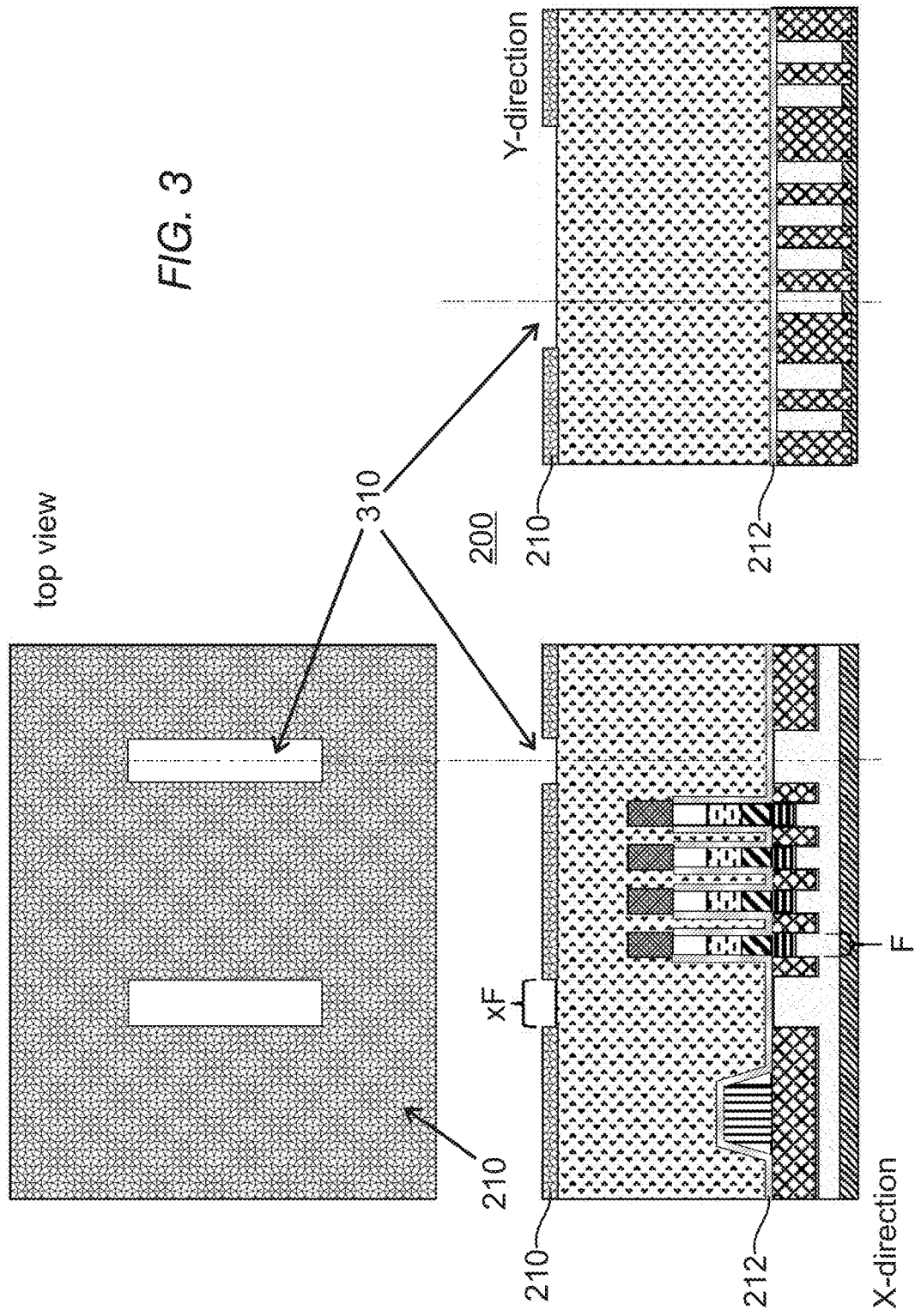

FIG. 3 is an illustration depicting a top view and also depicting cross-sectional views of a portion of example PCM device 200 showing a stage of an example fabrication process, in accordance with an embodiment. As illustrated in FIG. 3, one or more openings, such as slots 310, may be formed in the dielectric hard mask material 210, in an embodiment. Slots 310 may be formed at least in part utilizing a photolithographic mask technique, for example. The slots 310 may be defined by a "non-critical" mask with resolution lower than the technology node. In an embodiment, a mask comprising feature dimensions greater than a reduced feature size may be utilized to position and/or form one or more slots 310, for example. As depicted in FIG. 3, if the technology node is defined by a feature width "F," slots 310 may comprise a width, labeled "xF" greater than F. Utilization of a non-critical mask with reduced resolution relative to a critical mask may provide a simplified mask operation, greater ease-of-manufacture, improved manufacturing yield, reduced manufacturing costs, and/or increased reliability, relative to a critical mask, to name but a few example potential benefits.

Figure 4:
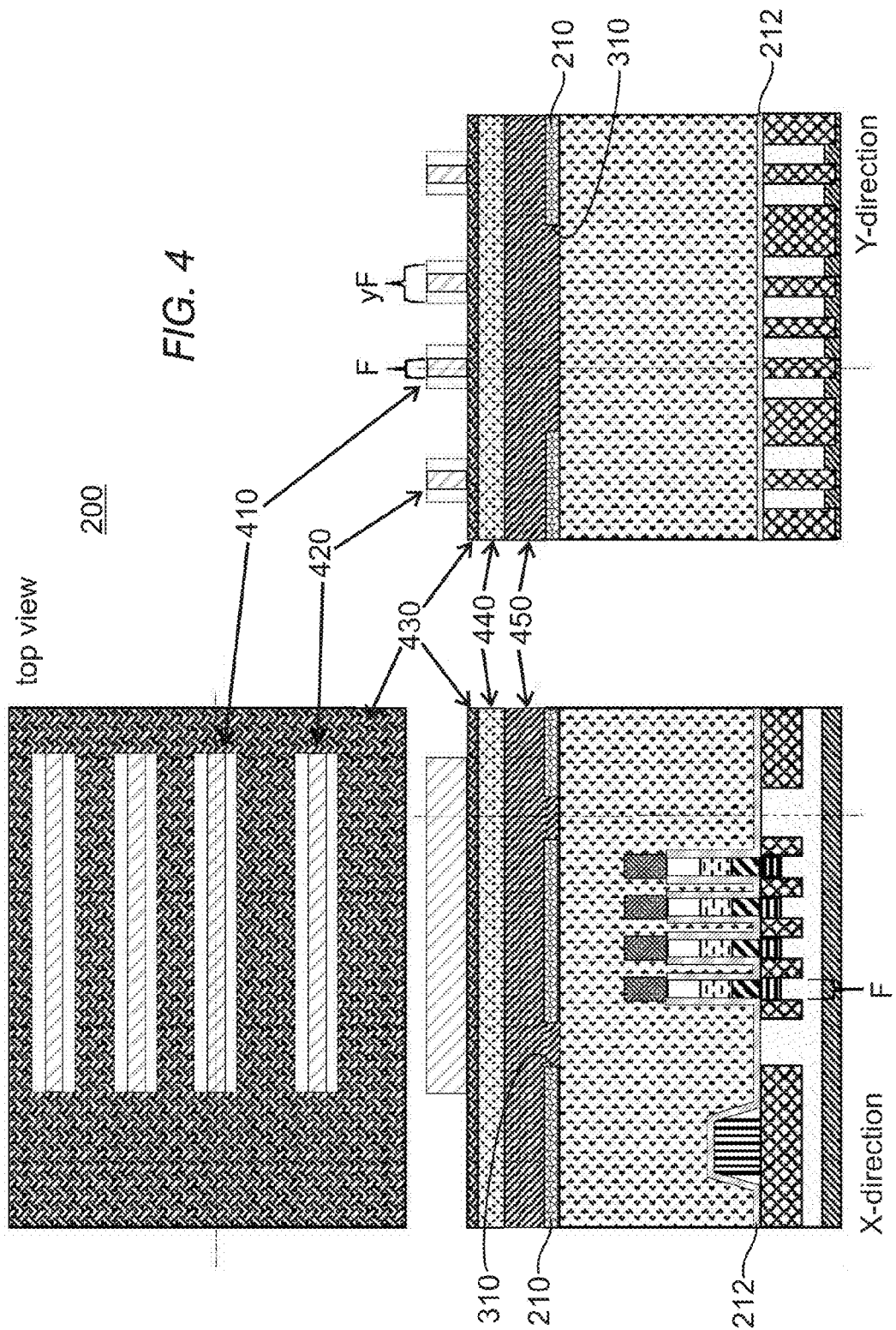

FIG. 4 is an illustration depicting a top view and also depicting cross-sectional views of a portion of example PCM device 200 showing a stage of an example fabrication process, in accordance with an embodiment. FIG. 4 depicts an interlevel dielectric material, such as an oxide material 450, deposited or otherwise formed on and/or over example PCM device 200. Additionally, a sacrificial hard mask material, such as an amorphous carbon material 440 may be deposited or otherwise formed on and/or over oxide material 450, in an embodiment. Also, in an embodiment, another hard mask material, such as a silicon nitride material 430, may be deposited or otherwise formed on and/or over carbon material 440, for example. In an embodiment, carbon material 440 and nitride material 430 may serve as an ashable hard mask (AHM) that may be utilized for electrode patterning, for example. Of course, claimed subject matter is not limited in scope in these respects.

As further depicted in FIG. 4, a photoresist (not shown) and another sacrificial hard mask material, such as bottom anti-reflective coating (BARC) material, may be deposited or otherwise formed over and/or on nitride material 430, and the sacrificial hard mask material may be patterned to form lines 410 and 420. In an embodiment, lines 420 may be referred to as "dummy" lines because lines 420 may be positioned over protective hard mask layer 210 without intersecting the slots 310 and as a result may not be utilized to form electrically conductive vertical interconnects to word-line contact regions 150. By contrast, lines 410 may be positioned above the slots 310 and may be utilized to form electrically conductive interconnects to word-line contact regions 150, in an embodiment. Dummy lines 420 may be positioned approximately at one or more edges of a PCM array, for example, although claimed subject matter is not limited in this respect.

In an embodiment, BARC lines 410 and/or 420 may be initially patterned by the lithography mask (not shown) to have a pitch more relaxed than a pitch for an example PCM storage array, for example. BARC lines 410 and/or 420 may comprise a width "yF" greater than a reduced feature size "F," for example, as depicted by the dotted outlines on the right-hand cross section of FIG. 4. Also, in an embodiment, to achieve a width of approximately a reduced feature size "F," a trimming operation may be performed on BARC lines 410 and/or 420. An example trimming operation for BARC material of lines 410 and/or 420 may comprise an anisotropic etch, although claimed subject matter is not limited in this respect. In an embodiment, lines 410 and/or 420 may be trimmed to a width smaller than that obtainable via lithographic techniques, for example. The trimmed width F of the hard mask lines are represented by the darkened middle portions of the initially formed lines yF in FIG. 4. At this point, the pitch (repetition length) of the lines 410 and 420 remains the same as initially defined by lithography, since trimming merely increases the spacing between lines 410 and 420 by the amount that the lines shrink.

Figure 5:
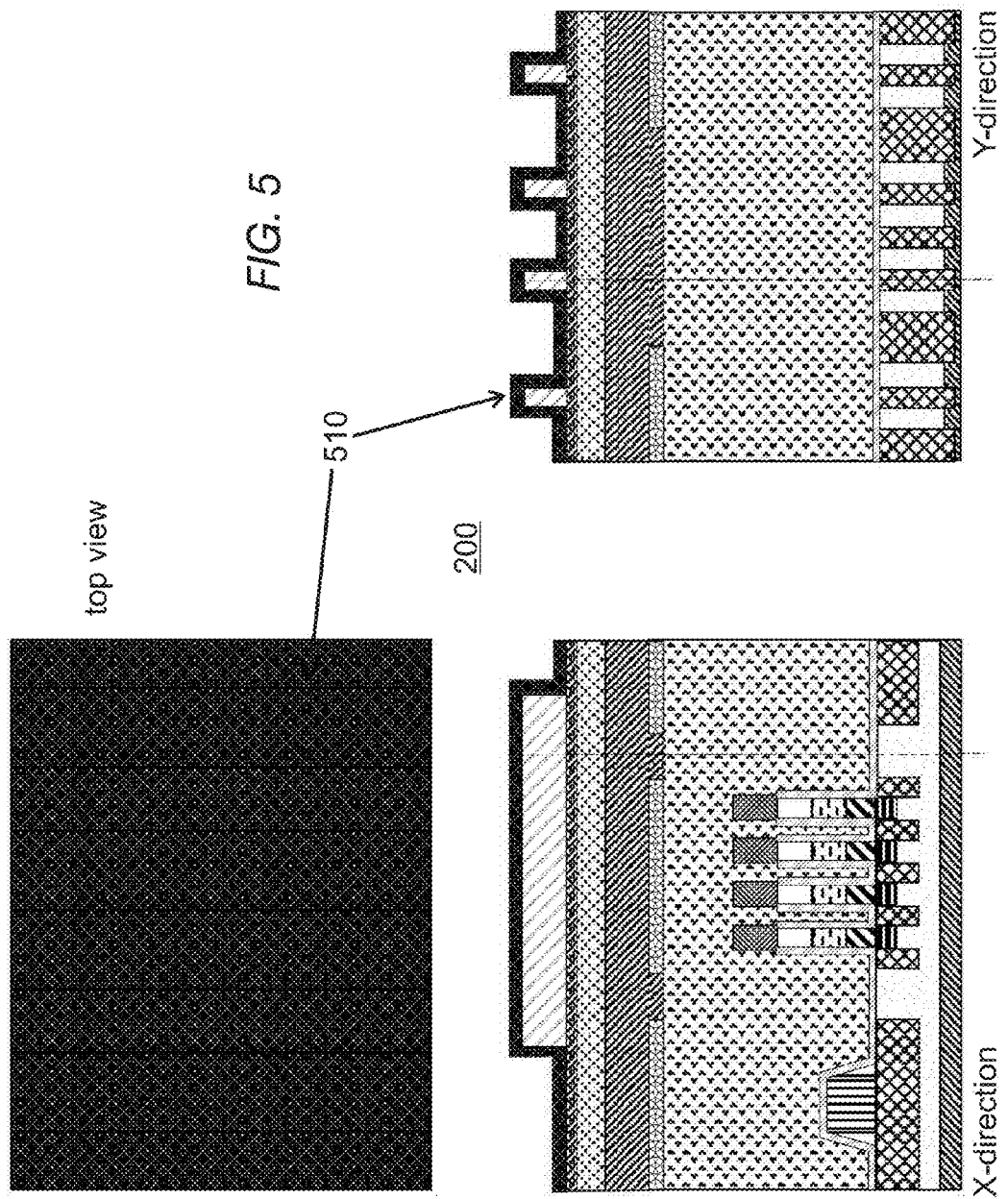

FIG. 5 is an illustration depicting a top view and also depicting cross-sectional views of a portion of example PCM device 200 showing a stage of an example fabrication process, in accordance with an embodiment. As depicted in FIG. 5, a conformal spacer layer 510, such as a dielectric material, may be conformally deposited and/or otherwise formed over and/or on example PCM device 200, including over and/or on lines 410 and/or 420, in an embodiment. In one embodiment, the spacer layer 510 can comprise a low-temperature oxide (LTO) material, such as a form of silicon oxide formed by atomic layer deposition (ALD) or plasma enhanced atomic layer deposition (PEALD). In other embodiments, the conformal spacer layer 510 can be a silicon nitride, for example, although the claimed subject matter is not limited in this respect.

Figure 6:
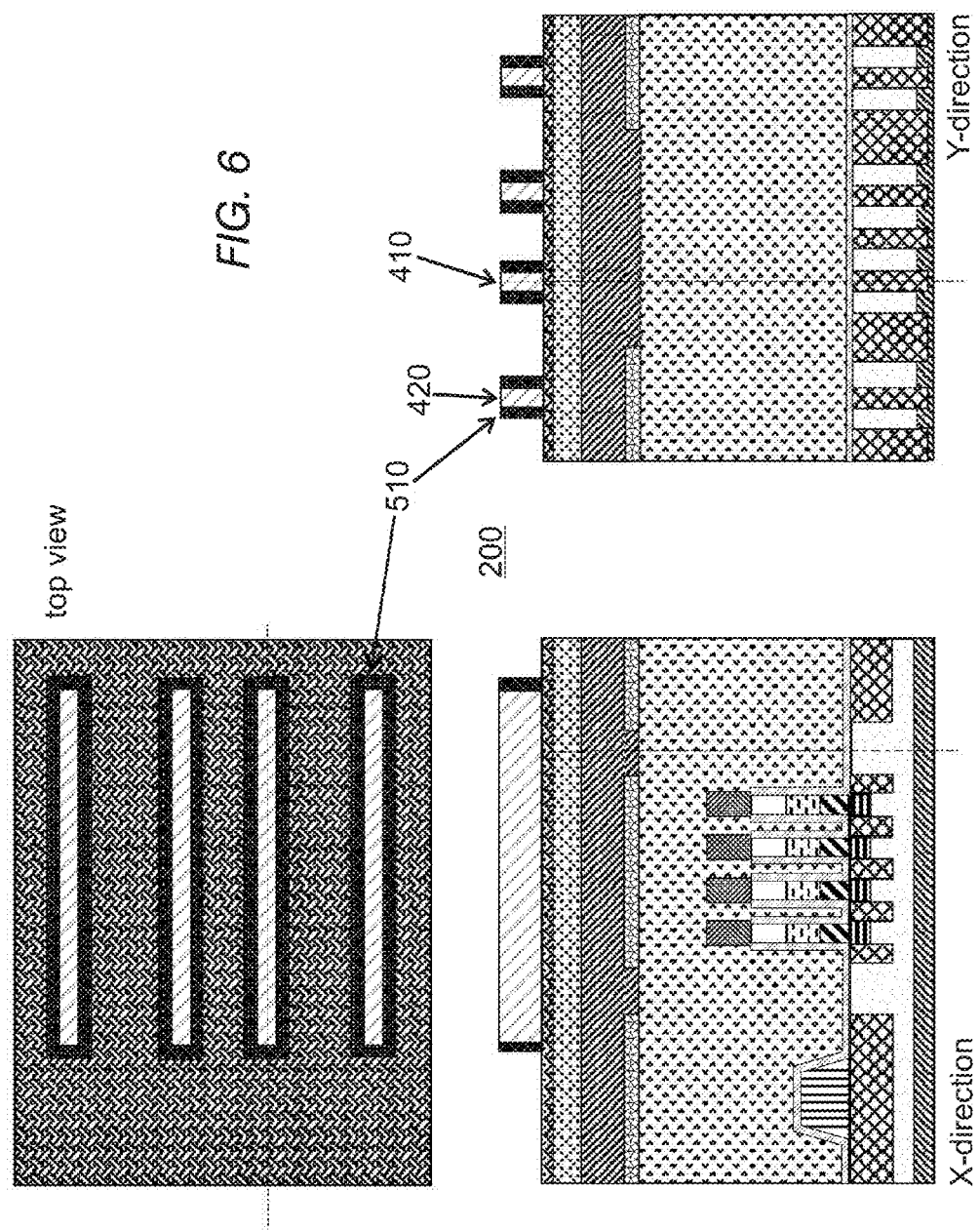

FIG. 6 is an illustration depicting a top view and also depicting cross-sectional views of a portion of example PCM device 200 showing a stage of an example fabrication process, in accordance with an embodiment. As depicted in FIG. 6, the spacer layer 510 may be etched to form sidewall spacers positioned on substantially vertical sides of lines 410 and/or 420, in an embodiment.

Figure 7:
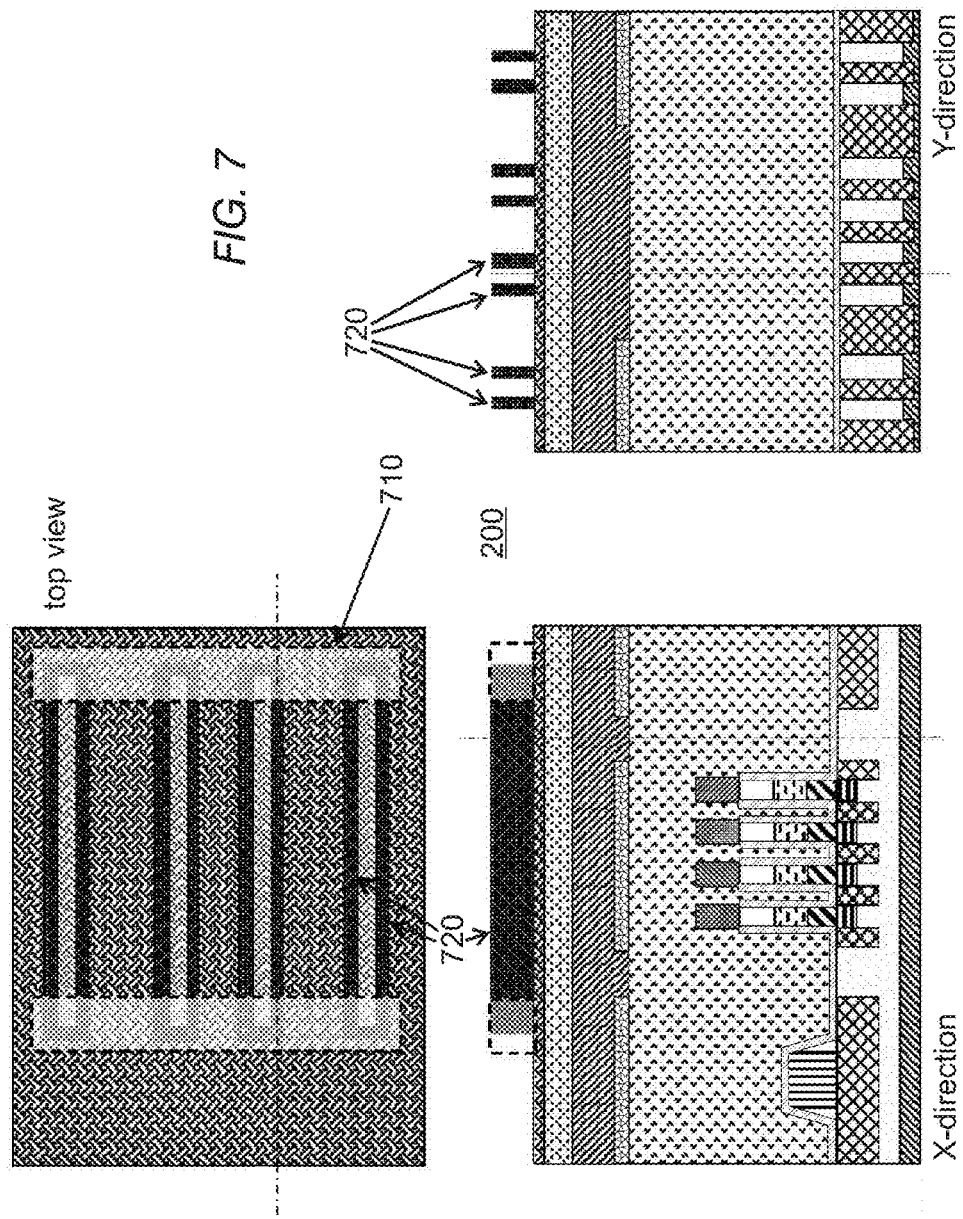

FIG. 7 is an illustration depicting a top view and also depicting cross-sectional views of a portion of example PCM device 200 showing a stage of an example fabrication process, in accordance with an embodiment. As depicted in FIG. 7, remaining mandrel material (e.g., BARC) may be selectively etched to remove lines 410 and/or 420 while avoiding substantial damage to spacer material 510. As further depicted in FIG. 7, removing lines 410 and/or 420 may result in formation of free-standing spacers 720 that may be utilized to pattern word-line electrodes and vertical interconnects, as discussed below. In an embodiment, a cut mask 710 may be utilized to remove selected spacer material, particularly the loop ends, to avoid shunted and/or shorted word-lines, for example. The cut mask 710 is illustrated as an opening in a mask for etching the loop ends of the spacers 720. In an alternative arrangement (not shown), instead of a cut mask the loop ends of the spacers 720 may be covered by a blocking mask, and in subsequent processing the spacer pattern may be transferred down by etching lower layers, and the blocking mask prevents the loop end portions of the pattern from transferring down. Use of a blocking mask instead of a cut mask may entail a slight different mandrel pattern relative to the illustrated embodiment, and can obviate the processes of FIGS. 8-11 for inverting the pattern, and the spacers at this stage represent the spaces between damascene trenches after transfer down. At this stage, the pattern of free standing spacers 720 can be considered to be pitch multiplied, or double patterned, because there are now two features for every feature defined by the original lithography (see FIG. 4)

Figure 8:
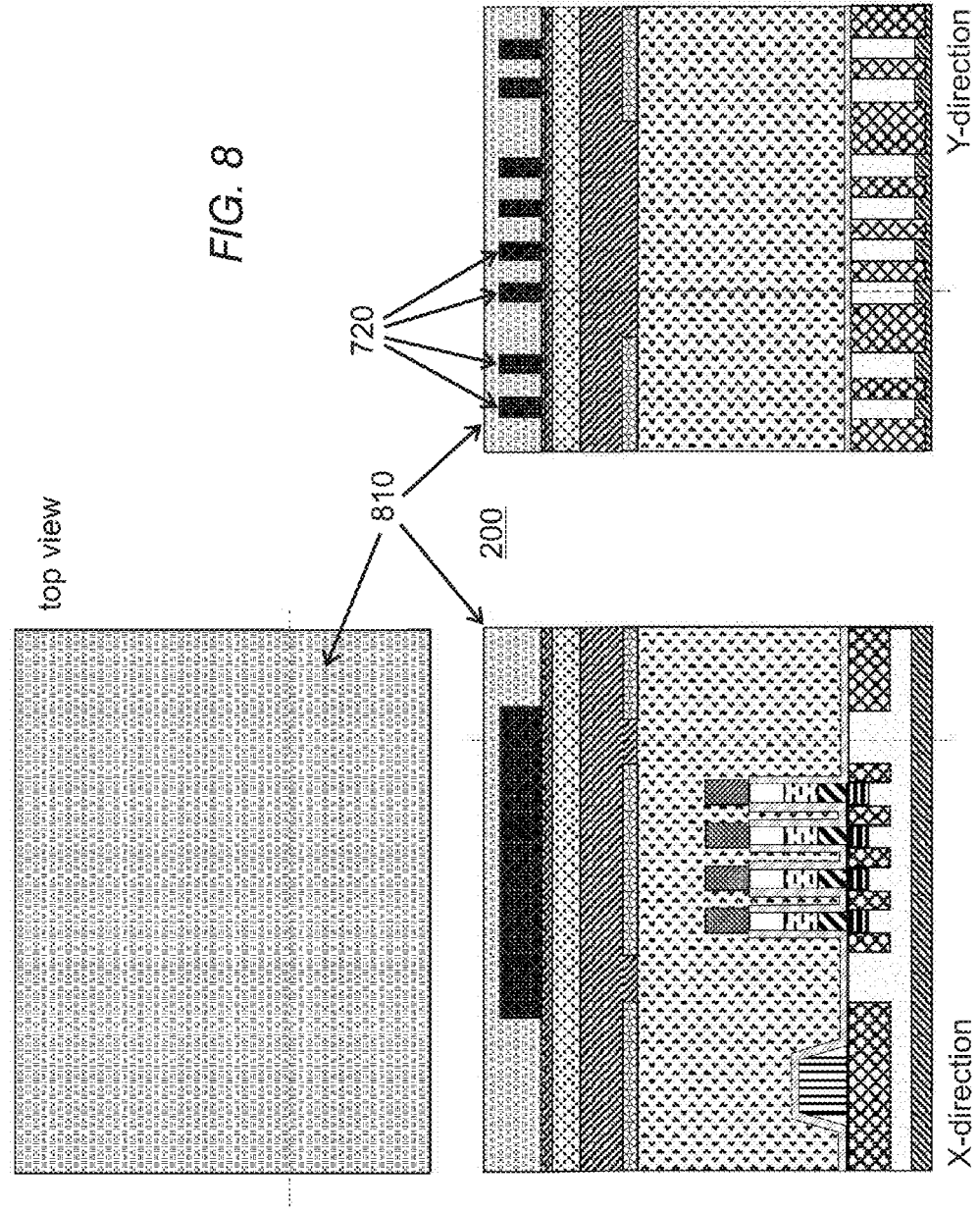

FIG. 8 is an illustration depicting a top view and also depicting cross-sectional views of a portion of example PCM device 200 showing a stage of an example fabrication process, in accordance with an embodiment. As depicted in FIG. 8, a layer of material, such as dielectric material 810, may be deposited or otherwise formed over and/or on example PCM device 200, including over spacers 720, for example.

Figure 9:
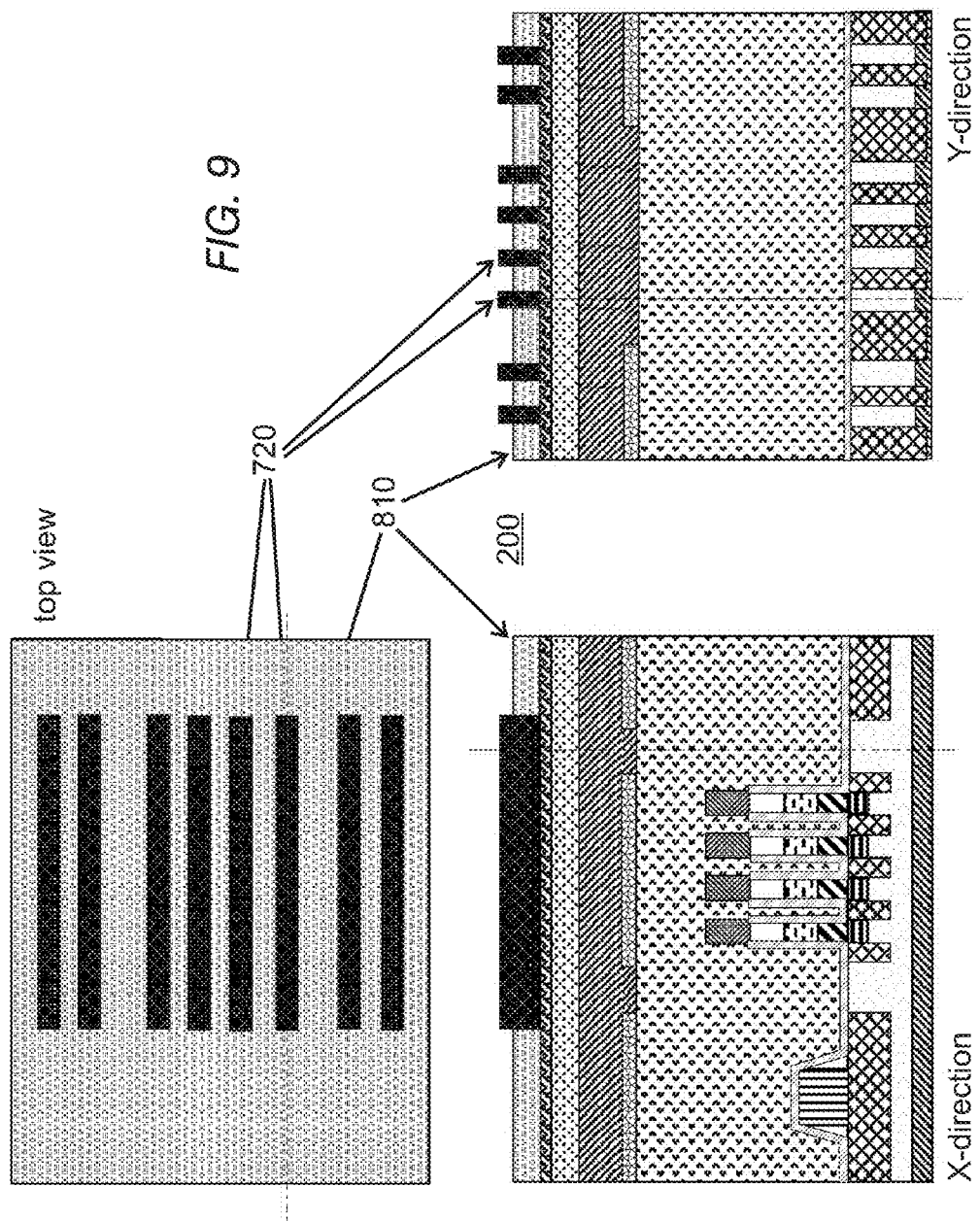

FIG. 9 is an illustration depicting a top view and also depicting cross-sectional views of a portion of example PCM device 200 showing a stage of an example fabrication process, in accordance with an embodiment. As depicted in FIG. 9, dielectric material 810 may be etched back to expose a portion of spacers 720, in an embodiment.

Figure 10:
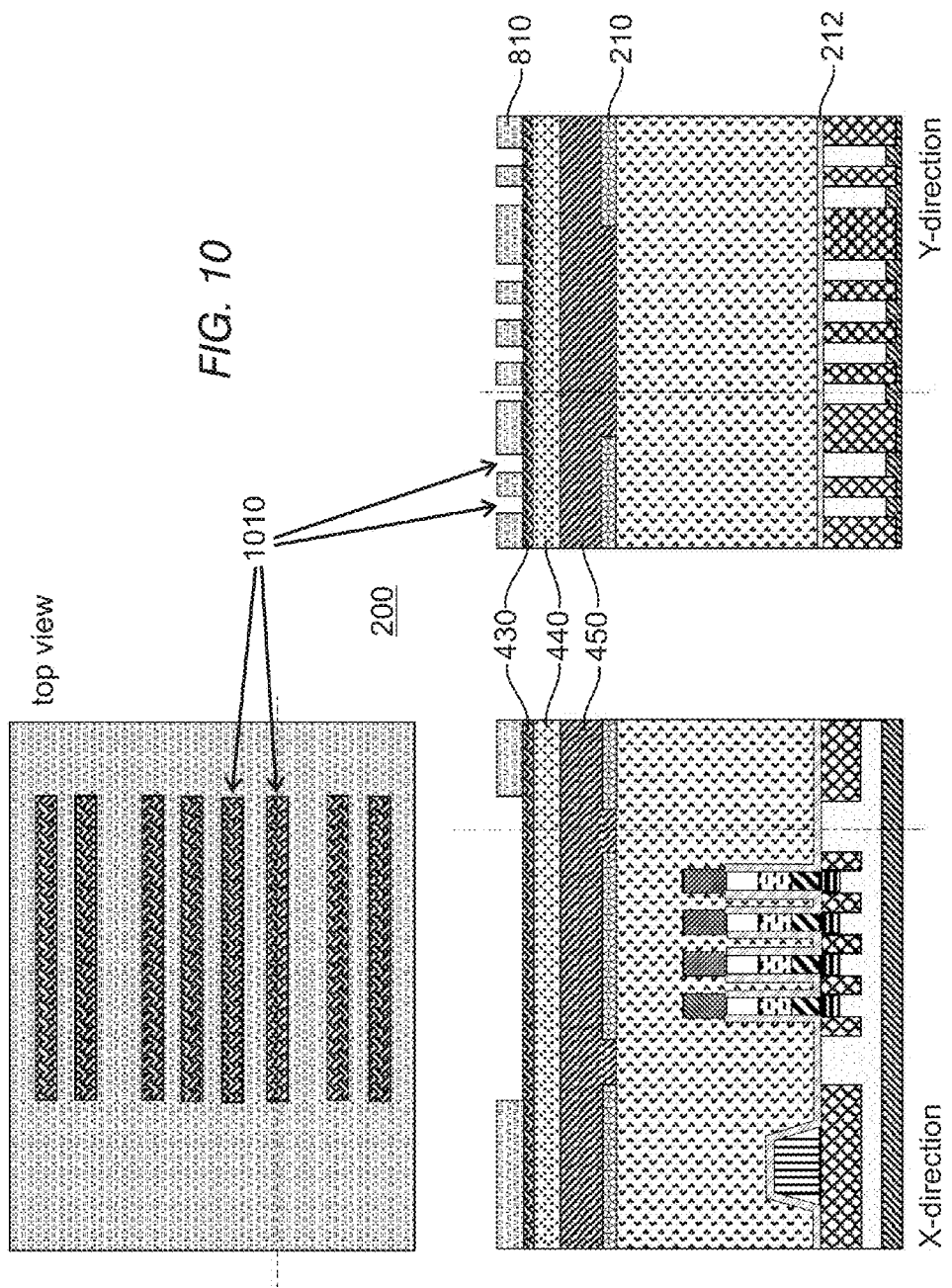

FIG. 10 is an illustration depicting a top view and also depicting cross-sectional views of a portion of example PCM device 200 showing a stage of an example fabrication process, in accordance with an embodiment. As depicted in FIG. 10, spacers 720 may be removed. In an embodiment, removing spacers 720 may result in trenches 1010. Also in an embodiment, trenches 1010 may selectively expose AHM material, comprising nitride material 430 and amorphous carbon material 440. Trenches 1010 may subsequently be utilized to pattern nitride material 430 and carbon material 440, as discussed below. The pattern of the trenches 1010 may be considered the negative image of the pattern of the spacers 720 of FIG. 7. Nevertheless, the pattern of trenches 1010 and subsequent patterns derived from it may be considered pitch multiplied patterns, pitch doubled patterns, spacer patterns and/or double patterned features.

Figure 11:
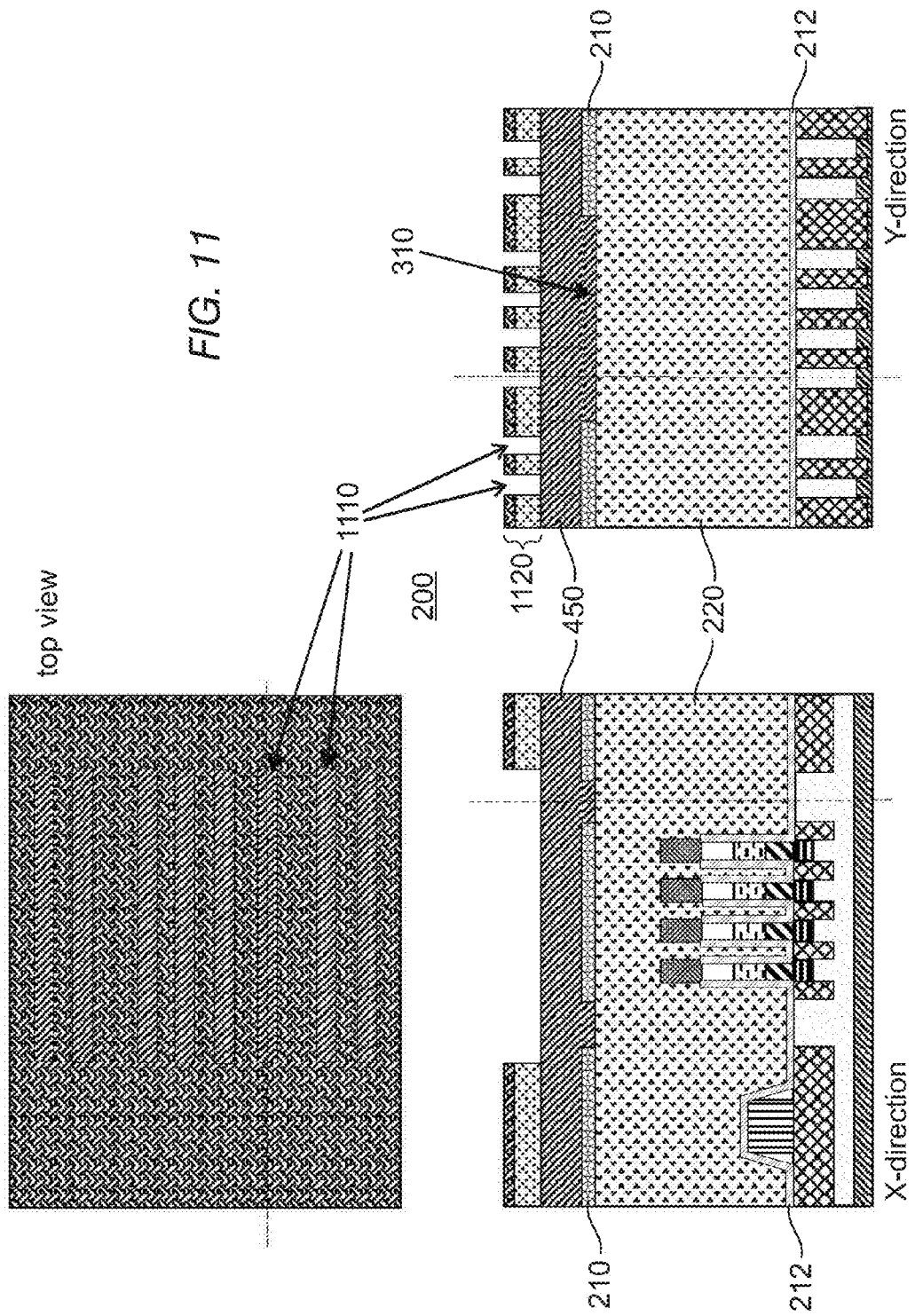

FIG. 11 is an illustration depicting a top view and also depicting cross-sectional views of a portion of example PCM device 200 showing a stage of an example fabrication process, in accordance with an embodiment. As depicted in FIG. 11, AHM material 1120, comprising nitride material 430 and amorphous carbon material 440 in an embodiment, may be patterned by way of an etching process, utilizing dielectric material 810 (FIG. 10) as a self-aligning mask, for example. For example, trenches 1110 may be formed in AHM material 1120, wherein trenches 1110 may extend in depth approximately to oxide material 450, in an embodiment. During and/or after etching AHM material 1120 to form trenches 1110, dielectric material 810 (FIG. 10) may be removed, as also depicted in FIG. 11, in an embodiment.

FIG. 12 is an illustration depicting a top view and also depicting cross-sectional views of a portion of example PCM device 200 showing a stage of an example fabrication process, in accordance with an embodiment. As depicted in FIG. 12, one or more word-line interconnect trenches 1210 may be formed in oxide material 450 and in oxide material 220. In an embodiment, word-line interconnect trenches 1210 may be formed at least in part by etching oxide material 450 and oxide material 220, utilizing patterned AHM material 1120 (FIG. 11) to protect selected portions of oxide materials 220 and 450, for example. In this manner, material 1120 may define trenches 1210 in a first direction. Additionally, as depicted in FIG. 12, the buried hard mask layer 210 may serve to protect underlying structures from an etching process. In this manner, the slots 310 in the buried hard mask layer 210 may define trenches in a second direction essentially perpendicular to the first direction. Where the trenches 1210 intersect with the slots 310 of the hard mask, trenches 1210 extending in depth approximately to word-line contact regions 150 may be formed by an etching technique, thus forming contact vias through in the region of intersection. In contrast portions of trenches outside the slots 310, including non-intersecting portions of intersecting trenches 1210 as well as wholly non-intersecting trenches 1210 positioned over dummy word-line contact regions 205, extend only in depth to hard mask layer 210, which stops the etch.

Figure 13:
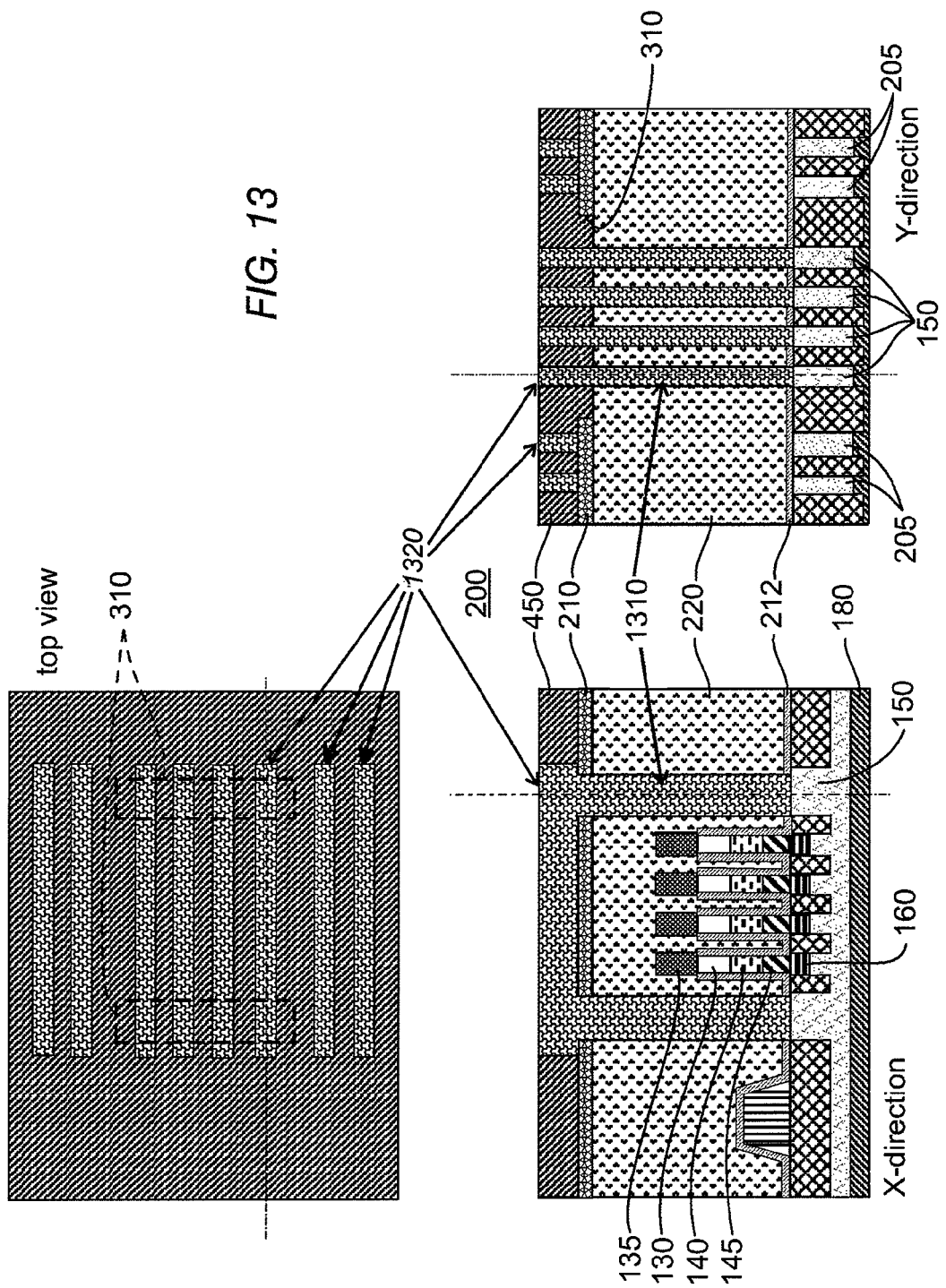

FIG. 13 is an illustration depicting a top view and also depicting cross-sectional views of a portion of example PCM device 200 showing a stage of an example fabrication process, in accordance with an embodiment. As depicted in FIG. 13, trenches 1210 (FIG. 12) may be filled with an electrically conductive material to form word-line interconnects 1310 (also known as vertical contacts) and/or word-line electrodes 1320 in elongated lines over and intersecting with the word-line interconnects 1310, in an embodiment. Example materials that may be utilized to fill trenches 1210 may include, for example, such as polysilicon and/or metallic material, such as tungsten, titanium nitride, and/or titanium aluminum nitride, although claimed subject matter is not limited in scope in this respect.

The horizontally oriented word-line electrodes 1320 are double patterned (pitch multiplied) to have feature width F, whereas the vertically oriented word-line interconnects 1310 are formed at the intersection of the slots 310 formed in the buried hard mask 210 and the word-line electrodes 1320. Thus, despite the fact that the mask defining the slots 310 was non-critical with dimensions larger than F in both X- and Y-directions, the contacts defined by the word-line interconnects 1310 have one dimension F (in the Y-direction) and another dimension larger than F (in the X-direction). The process is self-aligned in that the previously defined slot 310 in the hard mask 210 merely needs to intersect with the later formed double patterned lines, and the masks defining the slots 310 and the double patterned lines have a very wide alignment tolerance to ensure the trenches 1210 and slots 310 intersect at the stage of FIG. 12. Lateral dimensions of the word-line interconnect in the X-dimensions are confined by the slot 310 in the hard mask 210.

As discussed above, embodiments in accordance with claimed subject matter may simplify processes for forming electrically conductive vertical interconnects between buried silicon word-lines and corresponding "metal" word-line electrodes at least in part by creating self-aligned interconnects using non-critical mask steps in performing SADP technique to define the contact portions of the dual damascene scheme. Embodiments in accordance with claimed subject matter may comprise forming self-aligned via to connect one or more word-line electrodes with one or more buried word-line contact regions in a manner substantially integrated with double-patterning techniques utilized in fabricating PCM arrays with bipolar selector transistors. As previously mentioned, benefits that may be realized may include, for example, improved manufacturing yield, improved memory device reliability, reduced manufacturing costs, and increased memory density, although claimed subject matter is not limited in these respects.

In FIGS. 14-19, discussed below, cross-sectional views of an illustration of a portion of an example PCM memory array are depicted showing various stages of an example fabrication process, in accordance with an additional embodiment. Of course, claimed subject matter is not limited in scope to the particular examples described herein. In FIGS. 14-19 cross-sectional views looking in two directions, an "X" direction and a "Y" direction, are provided. In an embodiment, an "X" direction may be substantially orthogonal to a "Y" direction, though in other embodiments X and Y may cross without being orthogonal. Not shown in any detail in FIGS. 14-19, and not discussed herein except for a brief mention, is circuitry that may be formed around a periphery of a storage array, for example. Rather, FIGS. 14-19 are meant to illustrate example aspects related to fabrication of one or more electrically conductive vertical interconnects to electrically couple one or more electrodes, such as one or more word-line electrodes 1910 (FIG. 19), to one or more buried silicon word-lines, such as one or more n+ base components 170, in accordance with one or more embodiments.

For the example embodiment depicted in FIGS. 14-18, and as discussed below, instead of utilizing a pre-patterned buried hard mask to form a planar stopping layer, such as layer 210 depicted in FIGS. 2-13, protective hard mask materials can be formed without lithographic patterning over above a plurality of bit-line stacks. Additional processing stages may generate the word-line contact vias in which to form the word-line interconnects, although again, claimed subject matter is not limited in scope in these respects. An example alternative embodiment is described more fully below in connection with FIGS. 14-19.

Figure 14:
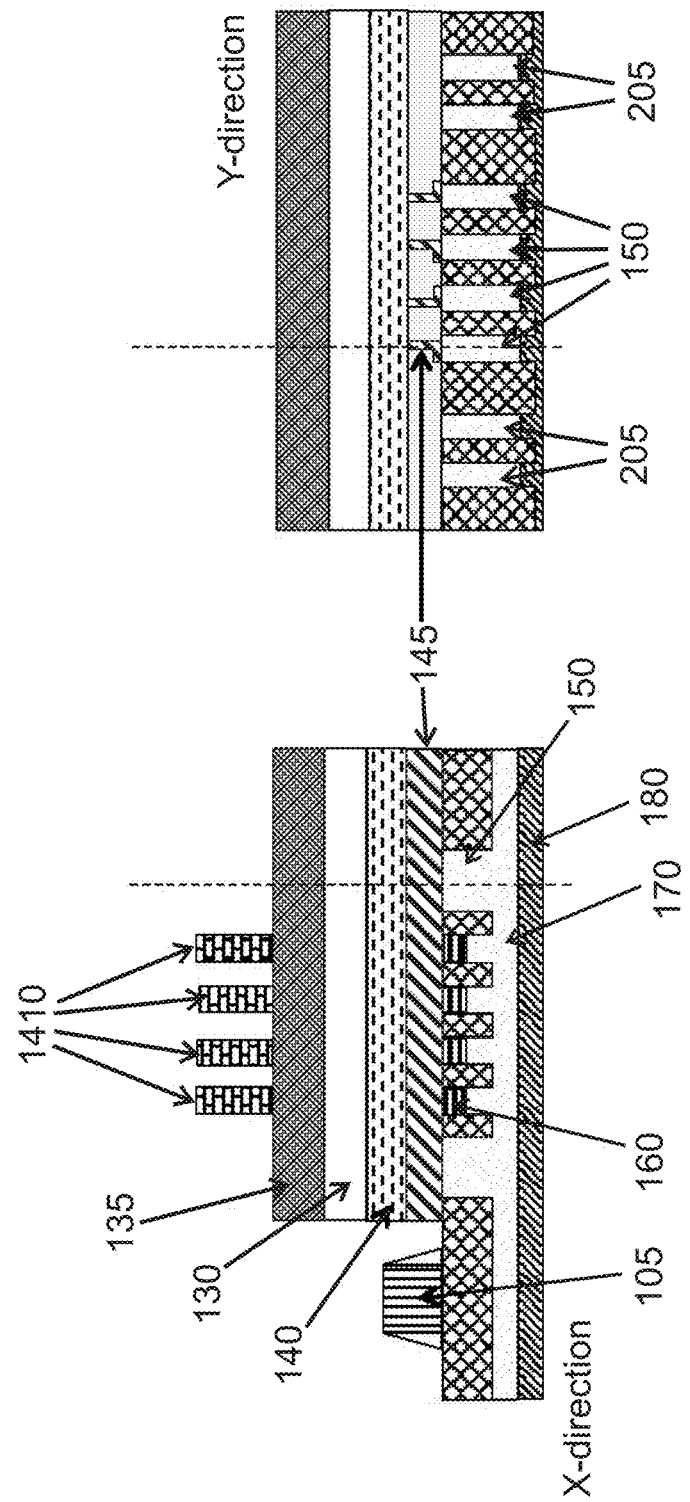
FIGS. 14-19 are illustrations depicting cross-sectional views of processing stages associated with forming an example memory device, such as a PCM device, according to another embodiment.

FIG. 14 is an illustration depicting cross-sectional views of a processing stage associated with forming an example PCM device 1400 showing a stage of an example fabrication process, in accordance with an embodiment. At a stage of an example fabrication process of example PCM device 1400, CMOS or other logic circuitry 105 may have been previously formed in and/or on a substrate at and/or near a periphery of an array of PCM storage cells. Additionally, at a stage of an example fabrication process of PCM device 1400 depicted in FIG. 14, doping, deposition and patterning may have previously formed collector region 180, base region 170, and/or emitters 160. Also depicted in FIG. 14 are heater components 145 previously patterned in one direction and a phase change memory (PCM) material 140. Although heater components 145 are depicted, other embodiments may not comprise heater components, for example for a memory cell where the PCM material serves as a self-heater. Additionally, an electrically conductive contact layer 130 may have been previously formed on PCM material 140, at an example stage of PCM array fabrication process depicted in FIG. 14, in an embodiment. Further, in an embodiment, a layer of bit-line electrode material 135 may also have been previously formed at a stage of an example fabrication process of a PCM array depicted in FIG. 14. Additionally, hard mask elements 1410 comprising, e.g., an oxide material may have been previously formed on bit-line electrode layer 135, in an embodiment. As also depicted in FIG. 14, base contact regions 150 and "dummy" word-line contact regions 205 may also have been previously formed at a stage of an example fabrication process depicted in FIG. 14. In FIGS. 15-19, discussed below, alternative example techniques may be depicted to form and electrically couple one or more electrodes, such as one or more word-line electrodes, to one or more buried contact regions, such as word-line contact regions 150.

Figure 15:
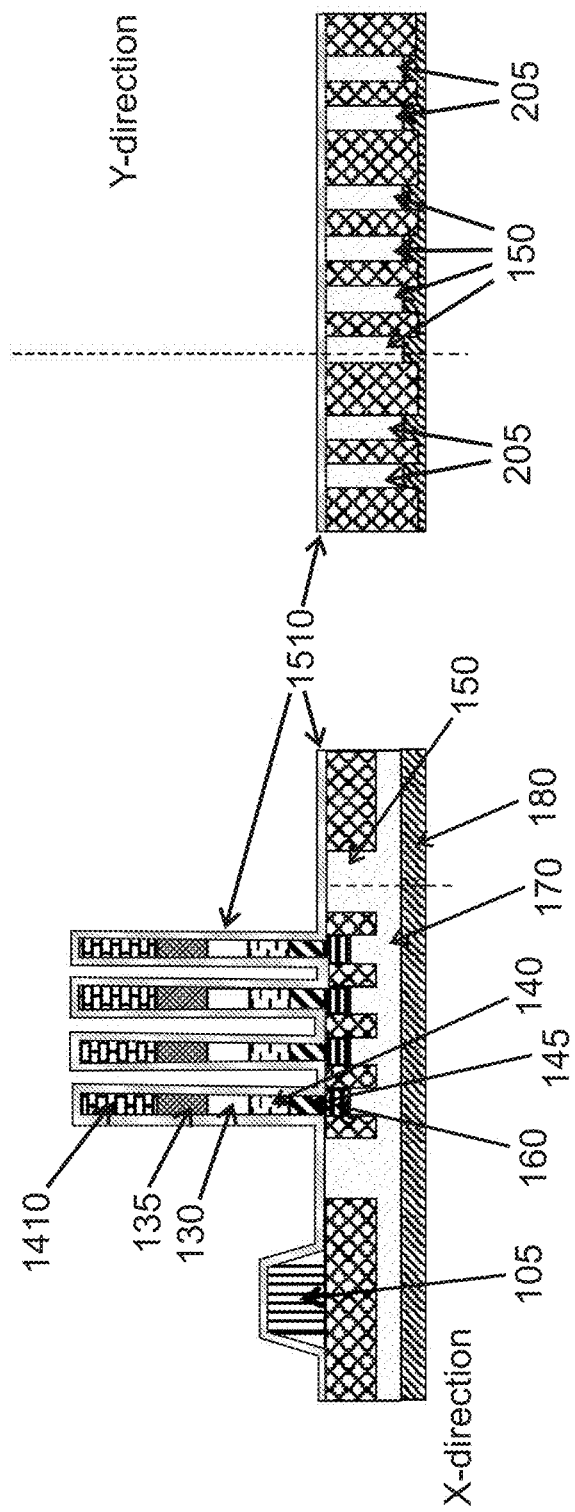

FIG. 15 is an illustration depicting cross-sectional views of a processing stage associated with forming an example PCM device 1400 showing a stage of an example fabrication process, in accordance with an embodiment. As depicted in FIG. 15, bit-line stacks comprising heater elements 145, PCM material 140, electrically conductive contacts 130, and bit-line electrodes 135 may be formed via an etching process utilizing oxide hard mask elements 1410 to protect the bit-line stacks. As also depicted in FIG. 15, a sealing layer 1510 of dielectric material, such as a silicon nitride layer, may be deposited or otherwise formed over and/or on PCM device 1400, including between the bit-line stacks comprising bit-lines 135, bit-line contacts 130, PCM material 140, and/or heater material 145.

Figure 16:
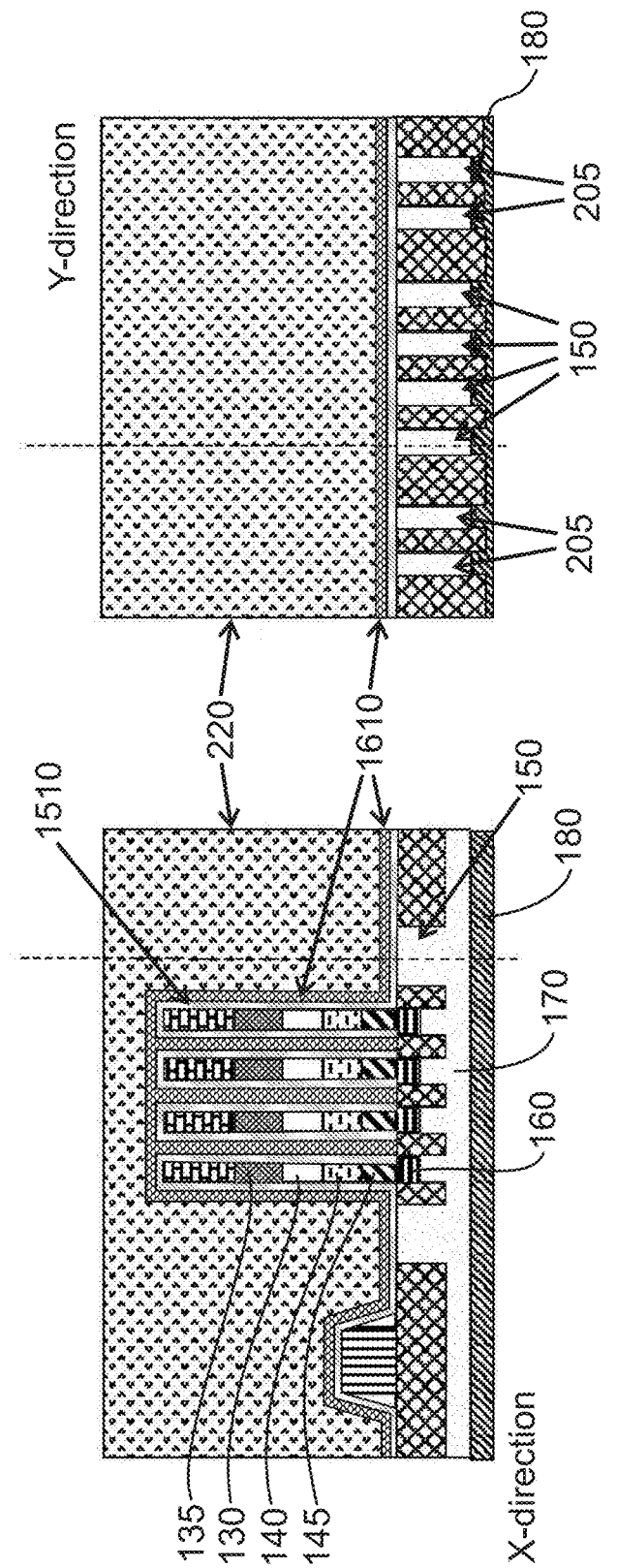

FIG. 16 is an illustration depicting cross-sectional views of a processing stage associated with forming an example PCM device 1400 showing a stage of an example fabrication process, in accordance with an embodiment. In an embodiment, nitride layer 1510 may be anisotropically etched to remove horizontal portions of the sealing layer 1510 from word-line contact regions 150 and from the tops of oxide hard mask elements 1410. Also, in an embodiment, an etch stop layer 1610 (such as silicon nitride) may be deposited or otherwise formed over and/or on PCM device 1400, including over and/or on the bit-line stacks and word-line contact regions 150. In an embodiment, a sufficient thickness of the etch stop layer 1610 can be deposited to substantially fill gaps between the closely spaced memory cells of groups of bit-lines between word-line contacts 150. In an embodiment, the sealing layer 1520 and etch stop layer 1610 on the sidewalls of the memory cells may protect edges of bit-lines 135, bit-line contacts 130, PCM material 140, and/or heater material 145, for example, during protracted exposure to a contact etch (see FIG. 18), whereas the etch stop layer 1610 on horizontal surfaces enables ready contact opening (see FIG. 18). Further, in an embodiment, a filling layer of insulating material, such as oxide 220, may be deposited or otherwise formed over the bit-line stacks and over the etch stop layer 1610. The etch stop layer 1610 can be considered a protective hard mask material to prevent subsequent etches from extending into semiconductor devices below the conductive lines to be formed and adjacent the vertical interconnects (contacts) to be formed.

Figure 17:
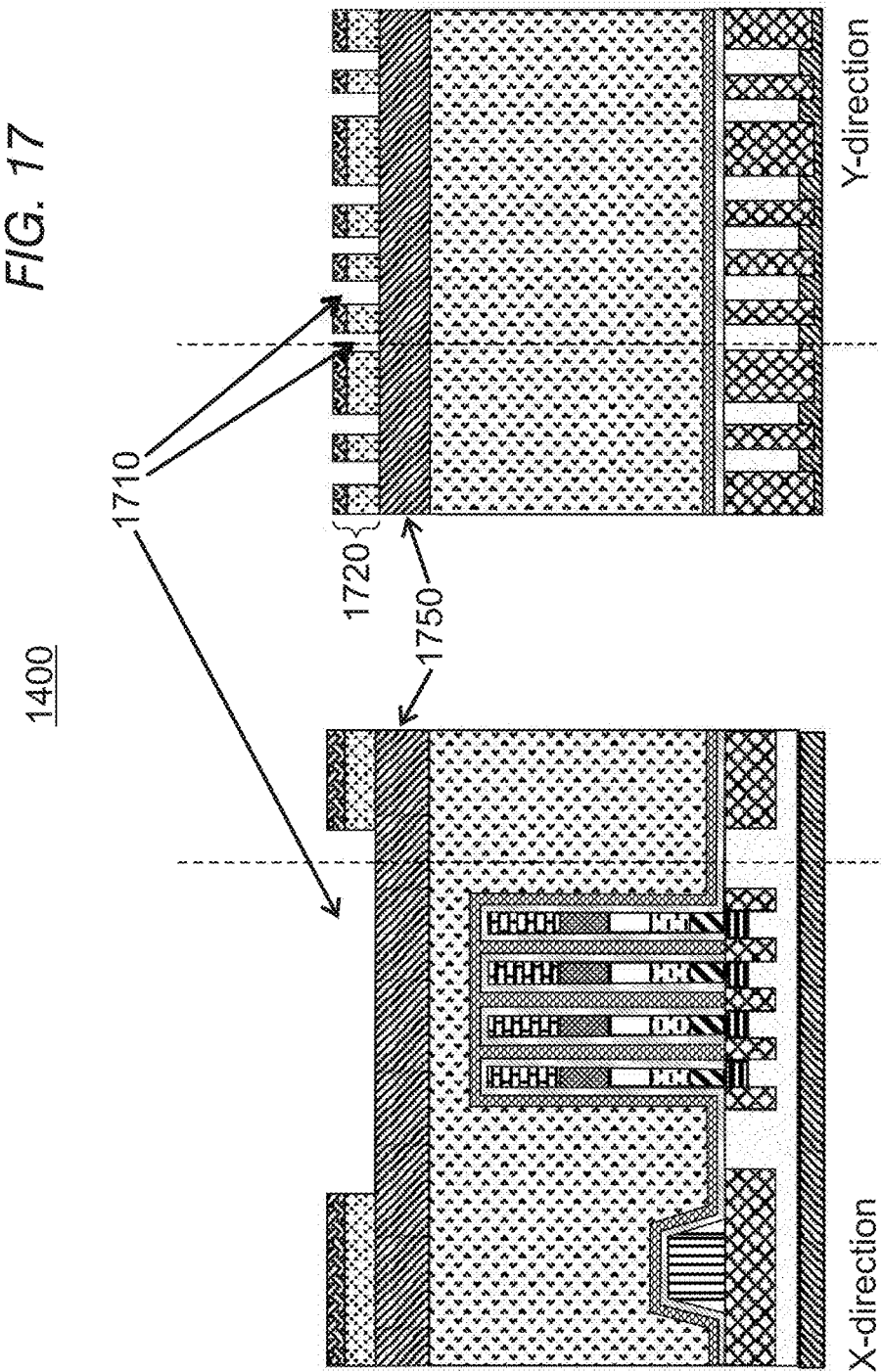
Figure 18:
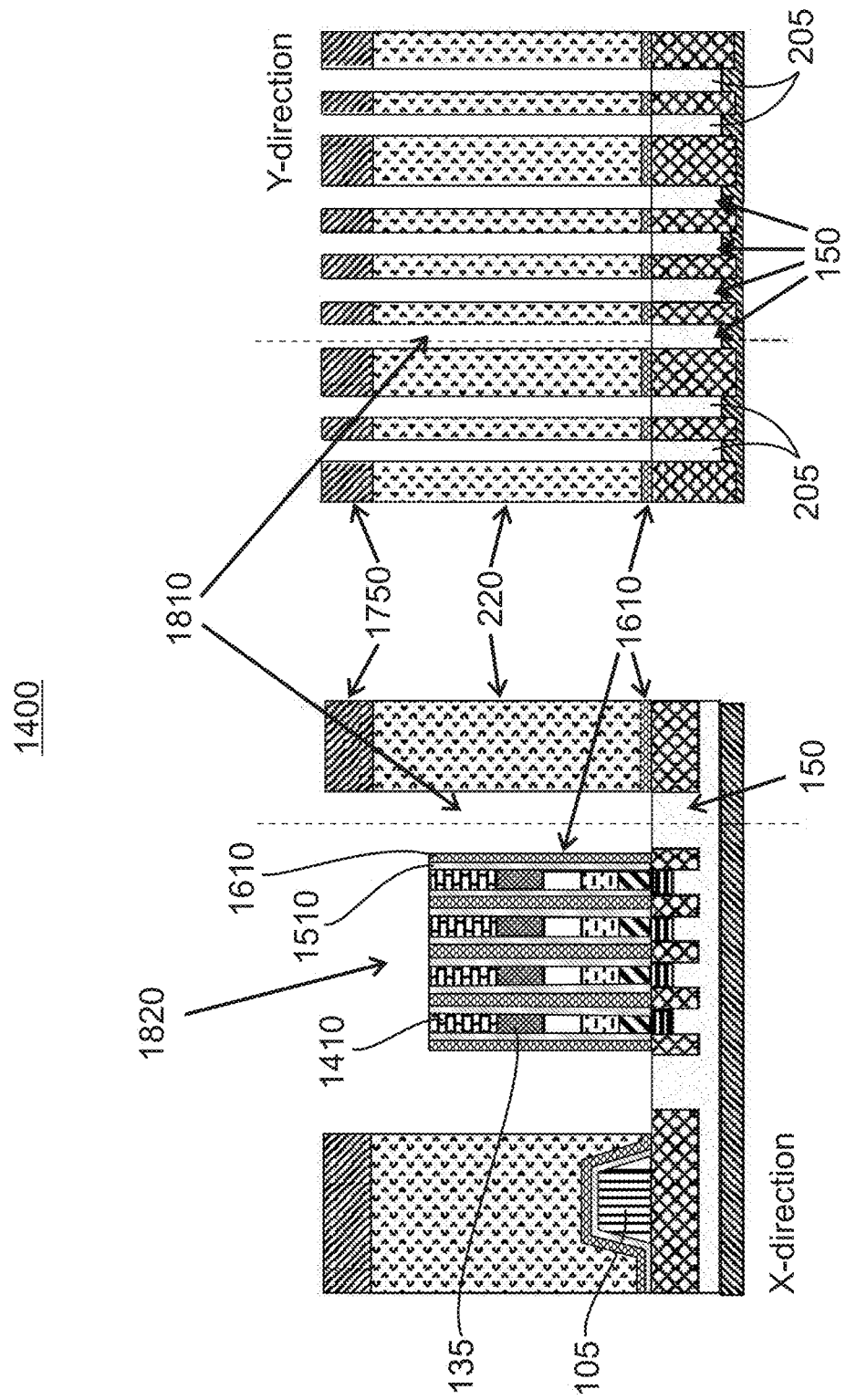
Figure 19:
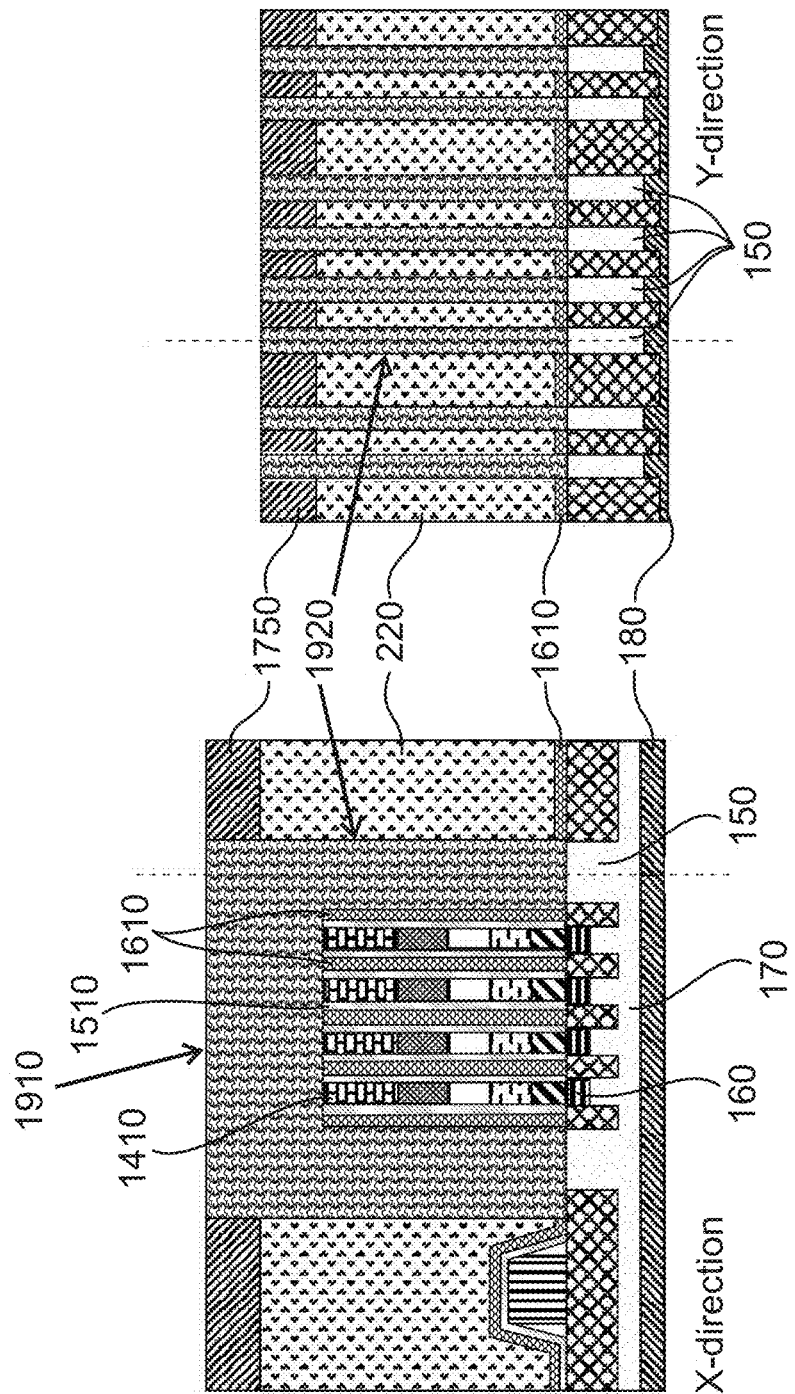

Example embodiments may follow damascene word-line process definition with SADP techniques similar to those described above in connection with FIGS. 2-13. For example, the structure of FIG. 17 can be obtained by a double patterning technique similar to the space-based pitch multiplication process of FIGS. 4-11. Furthermore, the process can be continued as depicted in FIGS. 17-19, to form double patterned lines and extend self-aligned contacts in using techniques similar to those described above in connection with FIGS. 11-13 to define dual damascene word-lines trenches and word-line contact vias, in an embodiment, and filling them with conductive material to form horizontal word-lines and vertical word-line interconnects (contacts). Of course, claimed subject matter is not limited in scope to the examples described herein.

FIG. 17 is an illustration depicting cross-sectional views of a portion of example PCM device 1400 showing a stage of an example fabrication process, in accordance with an embodiment. As depicted in FIG. 17, a hard mask such as AHM material 1720, comprising a nitride material and an amorphous carbon material in an embodiment, may be patterned by way of an etching process patterned utilizing photolithographic techniques and/or double patterning techniques as described above. For example, trenches 1710 may be formed in AHM material 1720 utilizing a spacer technique as described above, and the spacer pattern (or negative image thereof) can be transferred after use of a cut mask to remove spacer loop ends, as described above, or transferred with the use of a blocking mask to prevent transfer down of the spacer loop end portions of the spacer pattern. The trenches 1710 may extend in depth approximately to oxide material 1750, wherein oxide material 1750 is deposited and/or otherwise formed over and/or on oxide 220, in an embodiment.

FIG. 18 is an illustration depicting cross-sectional views of a portion of example PCM device 1400 showing a stage of an example fabrication process, in accordance with an embodiment. As depicted in FIG. 18, a word-line trench 1820 and one or more word-line interconnect trenches 1810, also referred to as contact vias, may be formed in oxide material 1750 and in oxide material 220. In an embodiment, word-line interconnect trenches 1810 may be formed at least in part by etching oxide material 1750 and oxide material 220, utilizing patterned AHM material 1720 to protect selected portions of oxide materials 220 and 1750, for example protecting CMOS or other logic circuitry 105. In this manner, material 1720 may define trenches 1810 in a first direction. In this manner, trenches 1810 extend in depth approximately down to the etch stop layer 1610. During the etch of the elongate conductor trenches 1820 and the contact vias 1810, the etch stop layer 1610 may serve as a protective hard mask material over the substrate level semiconductor devices, in this case memory cells that include selectors (e.g., BJT devices) and storage elements (e.g., PCM materials). The sealing layer 1510 can serve as an additional hard mask material to protect the memory cells. Also, in an embodiment, the etch chemistry can be changed or a physical etch can be employed such that the etch stop layer 1610 may be anisotropically etched, for example, within trenches 1810 to expose word-line contacts 150 and dummy word-line contacts 205. During this contact etch, since the etch stop layer 1610 has been removed from over the bit-line stacks (memory cells), the hard mask elements 1410 and remaining portions of the etch stop layer 1610 between the memory cells serve as additional hard mask material to protect the memory cells.

FIG. 19 is an illustration depicting a top view and also depicting cross-sectional views of a portion of example PCM device 1400 showing a stage of an example fabrication process, in accordance with an embodiment. As depicted in FIG. 19, trenches 1810 and 1820 may be filled with an electrically conductive material to form horizontally oriented word-line electrodes 1910 and vertically oriented word-line interconnects 1920, also referred to as word-line contacts, in an embodiment. Example materials that may be utilized to fill trenches 1810 and 1820 may include, for example, such as polysilicon, and/or metallic material, such as tungsten, titanium nitride, and/or titanium aluminum nitride, although claimed subject matter is not limited in scope in this respect.

Both the embodiments of FIGS. 13 and 19 may effectively employ a dual damascene process to simultaneously etch double patterned (or pitch multiplied) trench lines above the semiconductor devices (e.g., memory cells such as PCM memory cells) while extending contact vias of relaxed dimensions and pitch (compared to the line width) down to the buried contact (e.g., for communication with selector devices, such as BJT devices). The contact vias can be formed in a self-aligned manner due to hard mask materials (e.g., buried hard mask 210 or etch stop layer 1610) providing protection for semiconductor devices from the etch of the elongate trenches for pitch multiplied lines, while allowing extension of contact vias down to buried contacts in regions intersecting with the patterns of the pitch multiplied trenches. The alignment may be provided without a separate critical mask that might otherwise be employed to define individual contact holes in precise alignment with the narrow, pitch multiplied (or double patterned) line patterns. At least one lateral dimension of the vertical contact is confined by the hard mask materials in both embodiments. In FIG. 13, lateral dimensions of the word-line interconnect 1310 (contact) in the X-direction are confined by the slot 310 in the buried hard mask layer 210. In FIG. 19, lateral dimensions of the word-line interconnect 1920 (contact) in the X-direction are confined at least on one side by the etch stop layer 1610 on outer sidewalls of the bit-line stacks or memory cells.

From a comparison of FIGS. 13 and 19, it can be seen that the embodiment of FIG. 19 lacks the buried hard mask layer 210 that facilitated self-aligned contact formation in the embodiment of FIG. 13 and formed the floor for the electrode lines 1320. On the other hand, the embodiment of FIG. 19 includes other forms of hard mask protection for the lower level circuitry in the memory array region to permit self-aligned simultaneous formation of the word-line electrodes 1910 and the word-line interconnects 1920. Namely, with reference to FIG. 18, the etch stop layer 1610 controls the self-aligned etching of the electrode trench 1820 and contact via 1810 through the oxide materials 1750 and 220, after which the etch chemistry can be changed to remove exposed portions of the etch stop layer 1610. Moreover, during and after removal of the exposed portions of the etch stop layer 1610, the hard mask elements 1410 remain over the memory cell bit-lines 135 to protect the memory cells. Furthermore, during the prolonged etch of the contact vias 1810, without the buried hard mask 210 of the FIGS. 2-13 to confine the etch, the via etch exposes outer sidewalls of the memory cells. However, the dual sidewall protection afforded by the sealing layer 1510 and the etch stop layer 1610 protect the outer sidewalls of the memory cells. The embodiment of FIGS. 14-19 can omit a mask step by omitting the buried hard mask; on the other hand, the buried mask 210 of FIGS. 2-13 is defined by a non-critical, relatively inexpensive mask, and the memory cells can be distanced from the contact via etch such that other steps and structures (e.g., sealing layer 1510 of FIGS. 14-19) can be omitted.

Although example embodiments described herein describe negative and/or positive SADP techniques for forming vertical word-line interconnects, claimed subject matter is not limited in scope in this respect. Embodiments in accordance with claimed subject matter may utilize other techniques, including other SADP techniques, for forming electrodes, such as word-line interconnects, for example.

Accordingly, in an embodiment, a method is provided, including forming semiconductor devices over a substrate. A protective hard mask material is formed to protect the semiconductor devices. A dielectric material is formed over the protective hard mask material. One or more trenches are formed in the dielectric material while using the protective hard mask material to protect the semiconductor devices under the one or more trenches while extending one or more self-aligned contact vias from the one or more trenches to one or more electrode contact regions.

In some implementations, forming the protective hard mask material can be performed without a critical mask. Extending the one or more self-aligned contact vias can include exposing one or more word-line contact regions. The method can additionally include depositing an electrically conductive material in the one or more trenches to form one or more word-line electrodes in the one or more trenches and one or more word-line interconnects in the one or more self-aligned contact vias, where the word-line interconnects are in substantially direct contact with the one or more word-line contact regions. Extending the one or more self-aligned contact vias can also expose buried n+ silicon word-line contact regions. Forming semiconductor devices can include forming a phase change memory array having phase change memory cells. Forming the protective hard mask material can include forming a planar buried hard mask between the dielectric material and the phase change memory array. Forming the one or more trenches can include patterning mandrel lines over the planar buried hard mask and forming spacers over sidewalls of the mandrel lines. Forming the one or more trenches can additionally include utilizing the spacers as masks to pattern the one or more trenches. Forming the protective hard mask material can include depositing an etch stop layer conformally over the semiconductor devices. Forming the semiconductor devices can include forming additional hard mask elements on bit-line stacks that each include a bit-line electrode, a bit-line connector, and a phase change storage material; and patterning the bit-line stacks using the hard mask elements. Forming the one or more trenches can additionally include etching the etch stop layer to expose word-line electrode contact regions and the additional hard mask elements of the bit-line stacks.

In another embodiment, a memory device is provide, including one or more storage cells, which each include a selector transistor having a buried silicon component in substantially direct contact with an electrically conductive vertical contact electrically coupled to a horizontal electrode line. The electrode line has a line width defined by a double-patterning technique. The vertical contact has at least one dimension greater than the line width and confined on at least one edge by a hard mask material.

In some implementations, the horizontal electrode line can include a word-line electrode. The selector transistor of each of the one or more storage cells can include a bipolar junction transistor and the buried silicon component can include a base component of the bipolar junction transistor. Each of the one or more storage cells can include a phase change memory material electrically coupled between an emitter of the bipolar transistor and a bit-line electrode. The hard mask material can include a conformal etch stop layer over the bit-line electrode. The hard mask material can include a planar hard mask between an upper insulating layer and a lower insulating layer, where the upper insulating layer includes the horizontal electrode line embedded therein, and the lower insulating layer includes the vertical contact embedded therein.

In another embodiment, a method is provided for fabricating an integrated circuit. The method includes forming a hard mask over a first insulating layer, where the hard mask includes an elongate slot. A second insulating layer is formed over the hard mask. The method also includes etching trenches in the second insulating layer. The trenches intersect the elongate slot at intersections, and etching the plurality of trenches includes extending contact vias from the intersections of the trenches through the elongate slot and through the first insulating layer.

In some implementations, the method can additionally include a pitch-multiplication masking process to define a trench mask, and etching the plurality of trenches includes etching through the trench mask. The pitch-multiplication masking process can include defining mandrel mask lines by lithography, depositing sidewall spacers on the mandrel mask lines, and removing the mandrel mask lines from between the sidewall spacers. The method can additionally include defining the elongate slot with a non-critical mask.

In another embodiment, an integrated circuit is provided with a first insulating layer, a second insulating layer over the first insulating layer, and a hard mask formed between the first insulating layer and the second insulating layer, where the hard mask includes an elongate slot. The integrated circuit also includes conductive lines embedded within the second insulating layer. The conductive lines intersect with the elongate slot of the hard mask at intersections. Conductive contacts extend from the conductive lines at the intersections, through the elongate slot of the hard mask and through the first insulating layer.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

What is claimed is:

1. A memory device, comprising one or more storage cells individually comprising a selector transistor having a buried silicon component in substantially direct contact with an electrically conductive vertical contact electrically coupled to a horizontal electrode line, the electrode line having a line width defined by a double-patterning technique, the vertical contact having at least one lateral dimension greater than the line width and confined on at least one edge by a hard mask material.

2. The memory device of claim 1, wherein the horizontal electrode line comprises a word-line electrode.

3. The memory device of claim 2, wherein the selector transistor of each of the one or more storage cells comprises a bipolar junction transistor and the buried silicon component comprises a base component of the bipolar junction transistor.

4. The memory device of claim 3, wherein each of the one or more storage cells comprises a phase change memory material electrically coupled between an emitter of the bipolar transistor and a bit-line electrode.

5. The memory device of claim 4, wherein the hard mask material comprises a conformal etch stop layer over the bit-line electrode.

6. The memory device of claim 1, wherein the hard mask material comprises a planar hard mask between an upper insulating layer and a lower insulating layer, wherein the upper insulating layer comprises the horizontal electrode line embedded therein, and the lower insulating layer comprises the vertical contact embedded therein.

7. An integrated circuit comprising:
a first insulating layer;
a second insulating layer over the first insulating layer;
a hard mask formed between the first insulating layer and the second insulating layer, the hard mask including an elongate slot;
a plurality of conductive lines embedded within the second insulating layer, the conductive lines intersecting with the elongate slot of the hard mask at intersections; and
a plurality of conductive contacts extending from the conductive lines at the intersections, through the elongate slot of the hard mask and through the first insulating layer.

* * * * *